(12) United States Patent
Liu

(10) Patent No.: US 9,448,251 B2
(45) Date of Patent: Sep. 20, 2016

(54) INTEGRATED INERTIAL SENSOR AND PRESSURE SENSOR, AND FORMING METHOD THEREFOR

(75) Inventor: Lianjun Liu, Tianjin (CN)

(73) Assignee: MEMSEN ELECTRONICS INC, Tianjin (CN)

( * ) Notice: Subject to any disclaimer, the term of this patent is extended or adjusted under 35 U.S.C. 154(b) by 320 days.

(21) Appl. No.: 14/004,595

(22) PCT Filed: Feb. 23, 2012

(86) PCT No.: PCT/CN2012/071494
§ 371 (c)(1),
(2), (4) Date: Sep. 11, 2013

(87) PCT Pub. No.: WO2012/122878
PCT Pub. Date: Sep. 20, 2012

(65) Prior Publication Data
US 2013/0340525 A1 Dec. 26, 2013

(30) Foreign Application Priority Data
Mar. 15, 2011 (CN) .......................... 2011 1 0061470

(51) Int. Cl.
*G01P 15/125* (2006.01)
*G01P 15/02* (2013.01)
(Continued)

(52) U.S. Cl.
CPC ................ *G01P 15/02* (2013.01); *B81B 7/02* (2013.01); *G01C 19/574* (2013.01);
(Continued)

(58) Field of Classification Search
CPC ... G01P 15/125; G01L 9/0072; G01L 9/0073

USPC ............................................. 73/514.32, 714
See application file for complete search history.

(56) References Cited

U.S. PATENT DOCUMENTS 5,310,450 A * 5/1994 Offenberg ........... G01P 15/0802
148/DIG. 159
6,308,569 B1 * 10/2001 Stewart ................. B81B 7/0064
361/280

(Continued)

FOREIGN PATENT DOCUMENTS

CN 101331080 A 12/2008
CN 102180435 A 9/2011
(Continued)

OTHER PUBLICATIONS

International Search Report for International Application No. PCT/CN2012/071494; Date of Mailing: May 24, 2012 with English Translation.

*Primary Examiner* — John Chapman, Jr.
(74) *Attorney, Agent, or Firm* — Cantor Colburn LLP

(57) ABSTRACT

An integrated inertial sensor and pressure sensor may include a first substrate including a first surface and a second surface; at least one or more conductive layers, formed on the first surface of the first substrate; a movable sensitive element, formed by using a first region of the first substrate; a second substrate and a third substrate, the second substrate being coupled to a surface of the conductive layer, the third substrate being coupled to the second surface of the first substrate in which the movable sensitive element of the inertial sensor is formed, and the third substrate and the second substrate are respectively arranged on opposite sides of the movable sensitive element; and a sensitive film of the pressure sensor, including at least a second region of the first substrate, or including at least one of the conductive layers on the second region of the first substrate.

20 Claims, 13 Drawing Sheets

(51) Int. Cl.
*G01P 15/08* (2006.01)
*B81B 7/02* (2006.01)
*H01L 29/84* (2006.01)
*G01C 19/574* (2012.01)
*G01C 19/5769* (2012.01)

(52) U.S. Cl.
CPC ...... *G01C 19/5769* (2013.01); *G01P 15/0802* (2013.01); *G01P 15/125* (2013.01); *H01L 29/84* (2013.01); *B81B 2201/025* (2013.01); *B81B 2201/0264* (2013.01)

(56) References Cited

U.S. PATENT DOCUMENTS

| | | | |
|---|---|---|---|
| 7,223,624 B2 * | 5/2007 | Wu | B60C 23/0408 438/52 |
| 7,518,493 B2 | 4/2009 | Bryzek et al. | |
| 8,216,882 B2 * | 7/2012 | Lin | B81B 7/02 257/E29.001 |
| 2006/0261424 A1 * | 11/2006 | Van Der Wiel | B60C 23/0408 257/417 |
| 2008/0028857 A1 | 2/2008 | Ayazi et al. | |
| 2009/0140356 A1 | 6/2009 | Yazdi | |
| 2010/0213789 A1 | 8/2010 | Igarashi | |

FOREIGN PATENT DOCUMENTS

| | | |
|---|---|---|
| CN | 102183677 A | 9/2011 |
| EP | 2096448 A2 | 9/2009 |
| TW | 201034933 A | 10/2010 |

\* cited by examiner

US 9,448,251 B2

INTEGRATED INERTIAL SENSOR AND PRESSURE SENSOR, AND FORMING METHOD THEREFOR

This is the U.S. National Stage of application no. PCT/CN2012/071494, filed on Feb. 23, 2012. Priority under 35 U.S.C. §119(a) and 35 U.S.C. §365(b) is claimed from Chinese Application No. 201110061470.5, filed Mar. 15, 2011, the disclosure of which is also incorporated herein by reference.

FIELD OF THE INVENTION

The invention relates to the technical field of semiconductor, and particularly to an integrated inertial sensor and pressure sensor and a method for forming the same.

BACKGROUND OF THE INVENTION

Since the end of 1980s, various microminiature sensors have been achieved with the development of the Micro-Electro-Mechanical-System (MEMS) technique.

Presently, the most widely used sensors mainly include MEMS pressure sensors and MEMS inertial sensors. The MEMS pressure sensor is a device for sensing pressure. Currently, the MEMS pressure sensor includes a Si-piezoresistive pressure sensor and a Si-capacitive pressure sensor, each of which is a micro-electro-mechanical sensor formed on a silicon wafer. The MEMS pressure sensors are widely used in various fields, for example, automotive electronics such as Tire Pressure Monitoring System (TPMS), consumer electronics such as tire pressure gauge and blood pressure gauge, industrial electronics such as digital pressure gauge, digital flow meter and industrial batch weighting.

The MEMS inertial sensor is a device which performs measurement by using inertia. In practical application, the MEMS inertial sensor generally refers to an accelerometer or a gyroscopic apparatus (which is also referred to as a gyroscope). According to different sensing principles, the MEMS inertial sensor may be classified into a piezoresistance sensor, a capacitive sensor, a piezoelectric sensor, a tunneling current sensor, a resonant sensor, a thermoelectric coupling sensor, an electromagnetic sensor, and the like. The MEMS inertial sensors are generally applied to the portable devices such as the mobile phones or the game devices in the consumer electronic field; are generally applied to the automotive electronic stability system (ESP or ESC) such as the car airbag or the vehicle gesture measurement or applied to the GPS assistant navigation system in the car field; and are generally applied to the communication satellite radio, the missile seeker or the like in the military or astronavigation field.

As described above, various sensors have been widely used in consumer electronics, automotive electronics and industrial electronics. However, due to the significant differences in manufacture and package method among various sensors, there is no integrated sensor product on the market now. Presently, the MEMS inertial sensor and the MEMS pressure sensor have been applied to the Tire Pressure Monitoring System (TPMS) of the car tire, but the existing acceleration sensor chip and the pressure sensor chip are designed and manufactured separately and then packaged together. For example, in the existing TPMS products manufactured by many companies (such as Infineon, Freescale, Bosch and GE), discrete inertial sensor chip, pressure sensor chip and signal processing circuit chips thereof are adopted and then packaged together, which causes a complicated overall process, a large size and a high cost. Such a method is described in U.S. Pat. No. 7,518,493 B2.

SUMMARY OF THE INVENTION

An object of the invention is to provide an integrated inertial sensor and pressure sensor and a method for forming the same, in order to overcome the shortcomings in the prior art such as process complexity, large size and high cost.

To solve the above problems, an integrated inertial sensor and pressure sensor is provided according to an embodiment of the invention, and the integrated inertial sensor and pressure sensor includes:

a first substrate, including a first surface and a second surface opposite to the first surface, and the first substrate including a first region and a second region;

at least one or more conductive layers, formed on the first surface of the first substrate;

a movable sensitive element of the inertial sensor, formed by using the first region of the first substrate;

a second substrate and a third substrate, where the second substrate is coupled to a surface of the conductive layer on the first surface of the first substrate; the third substrate is coupled to the second surface of the first substrate in which the movable sensitive element of the inertial sensor is formed, and the third substrate and the second substrate are respectively arranged on two opposite sides of the movable sensitive element of the inertial sensor; and a sensitive film of the pressure sensor, including at least the second region of the first substrate, or including at least one of the conductive layers on the second region of the first substrate.

Optionally, the first substrate is formed of monocrystalline semiconductor material.

Optionally, the conductive layer includes: a first electrical shielding layer for the inertial sensor, an electrical interconnecting layer for the inertial sensor and the pressure sensor, a supporting post of a fixed electrode of the inertial sensor, a supporting post of the movable sensitive element of the inertial sensor, or any combination thereof.

Optionally, the conductive layer includes a first electrical shielding layer of the inertial sensor.

Optionally, the conductive layer includes an electrical interconnecting layer for the inertial sensor, and the electrical interconnecting layer is closer to the first surface of the first substrate than the first electrical shielding layer.

Optionally, a conductive material layer is formed on the third substrate, and the sensitive film of the pressure sensor includes one of the conductive layers on the second region of the first substrate, or includes the second region of the first substrate; and a fixed electrode of the pressure sensor is formed by using another layer of the conductive layers on the second region of the first substrate, or formed by using the second region of the first substrate, or formed by using the conductive material layer on the third substrate.

Optionally, the sensitive film includes a material layer which is the same layer as that for forming the first electrical shielding layer for the inertial sensor, or includes a material layer which is the same layer as that for forming the electrical interconnecting layer for the inertial sensor.

Optionally, the fixed electrode of the pressure sensor is formed by using the second region of the first substrate, and a through hole is formed in the fixed electrode of the pressure sensor.

Optionally, the integrated inertial sensor and pressure sensor further includes a fixed electrode of the pressure sensor opposite to the sensitive film of the pressure sensor, and a movable sensitive element of the pressure sensor formed between the sensitive film of the pressure sensor and the fixed electrode of the pressure sensor, where the movable sensitive element of the pressure sensor is connected to the sensitive film by a connecting arm, and a through hole is formed in the movable sensitive element of the pressure sensor.

Optionally, the pressure sensor includes a plurality of sensitive films;

the sensitive films include one of the conductive layers, and a material layer above or below the conductive layer; or the sensitive films include a first substrate, and a material layer above or below the first substrate.

Optionally, the integrated inertial sensor and pressure sensor further includes:

a pressure port opening through which the sensitive film of the pressure sensor is exposed.

Accordingly, a method for forming an integrated inertial sensor and pressure sensor is further provided according to the invention, and the method includes:

providing a first substrate, where the first substrate includes a first surface and a second surface opposite to the first surface, and the first substrate includes a first region and a second region;

forming one or more conductive layers on the first surface of the first substrate;

providing a second substrate and a third substrate;

coupling the second substrate to a surface of the conductive layer on the first surface of the first substrate;

forming a movable sensitive element of the inertial sensor by using the first region of the first substrate;

forming a sensitive film of the pressure sensor, where the sensitive film includes at least the second region of the first substrate, or includes at least one of the conductive layers on the second region of the first substrate; and coupling the third substrate to the second surface of the first substrate in which the movable sensitive element of the inertial sensor is formed, where the third substrate and the second substrate are respectively arranged on two opposite sides of the movable sensitive element of the inertial sensor.

Optionally, the first substrate is formed of monocrystalline semiconductor material.

Optionally, the forming the conductive layer includes: forming a first electrical shielding layer for the inertial sensor, an electrical interconnecting layer for the inertial sensor and the pressure sensor, a supporting post of a fixed electrode of the inertial sensor, a supporting post of the movable sensitive element of the inertial sensor, or any combination thereof.

Optionally, the forming the conductive layer includes forming a first electrical shielding layer of the inertial sensor.

Optionally, the forming the conductive layer includes forming an electrical interconnecting layer for the inertial sensor, and the electrical interconnecting layer is closer to the first surface of the first substrate than the first electrical shielding layer.

Optionally, the method further includes: forming a conductive material layer on the third substrate, where the sensitive film of the pressure sensor includes one of the conductive layers on the second region of the first substrate, or includes the second region of the first substrate; and forming a fixed electrode of the pressure sensor by using another layer of the conductive layers on the second region of the first substrate, or by using the second region of the first substrate, or by using the conductive material layer on the third substrate.

Optionally, the sensitive film of the pressure sensor includes a material layer which is the same layer as that for forming the first electrical shielding layer for the inertial sensor, or includes a material layer which is the same layer as that for forming the electrical interconnecting layer for the inertial sensor.

Optionally, the method further includes: forming a fixed electrode of the pressure sensor by using the second region of the first substrate, and forming a through hole in the fixed electrode of the pressure sensor.

Optionally, the method further includes:

forming a fixed electrode of the pressure sensor opposite to the sensitive film of the pressure sensor;

forming a movable sensitive element of the pressure sensor between the sensitive film of the pressure sensor and the fixed electrode of the pressure sensor;

forming a connecting arm between the movable sensitive element of the pressure sensor and the sensitive film for connecting the movable sensitive element of the pressure sensor with the sensitive film; and forming a through hole in the movable sensitive element of the pressure sensor.

Optionally, the pressure sensor includes a plurality of sensitive films;

the sensitive films of the pressure sensor include one of the conductive layers, and a material layer above or below the conductive layer; or the sensitive films of the pressure sensor include a first substrate, and a material layer above or below the first substrate.

Optionally, the method further includes: forming a pressure port opening through which the sensitive film is exposed.

Optionally, the method further includes: forming a bonding pad on the third substrate; and exposing the bonding pad while forming the pressure port opening.

As compared with the prior art, the embodiments of the invention have the following advantages. Since the movable sensitive element of the inertial sensor is formed by using the first substrate and the sensitive film of the pressure sensor is formed by using the first substrate or one of the conductive layers on the first substrate, the formed integrated pressure sensor and inertial sensor has a small size, a low cost and a high reliability after packaging.

Moreover, in the embodiments of the invention, since the sensitive element of the inertial sensor is formed of monocrystalline semiconductor material, thicker movable sensitive element, i.e., the movable electrode, of the inertial sensor may be formed, therefore increasing the mass of the element. The sensitivity and reliability of the inertial sensor can be improved.

Further, in the embodiments of the invention, one or more conductive layers are formed on the first substrate, and the conductive layer may be used to form the electrical interconnecting layer for the inertial sensor and the pressure sensor, therefore the electrical interconnecting layer for the pressure sensor and the inertial sensor may be formed by using a common conductive layer, and the size of the integrated inertial sensor and pressure sensor is further reduced.

Further, in the embodiments of the invention, besides the electrical interconnecting layer for the inertial sensor, the conductive layer may further include the first electrical shielding layer for the inertial sensor, the supporting post of the fixed electrode of the inertial sensor, the supporting post of the movable sensitive element of the inertial sensor or any combination thereof. These materials may be used to form different structures of the pressure sensor, such as the sensitive film and/or the movable sensitive element or the fixed electrode of the pressure sensor. Thus, in one aspect, the size of the integrated inertial sensor and pressure sensor is reduced; and in another aspect, the manufacturing process is simpler, the flexibility for manufacturing the device is enhanced, the layout becomes easier, and the flexibility for integrating with other devices is improved.

In the embodiments of the invention, the electrical shielding layer is electrically connected with the shielding interconnecting line of the electrical interconnecting layer, and therefore the inertial sensor is prevented from being interfered by an external electrical signal.

In the embodiments of the invention, the pressure sensor may include one or more sensitive films, therefore the integrated pressure sensor and inertial sensor formed according to the embodiments of the invention can be used in the case that the pressure is relatively high, and can also be used in the case that the pressure is relatively low.

DETAILED DESCRIPTION OF THE INVENTION

Figure 1:
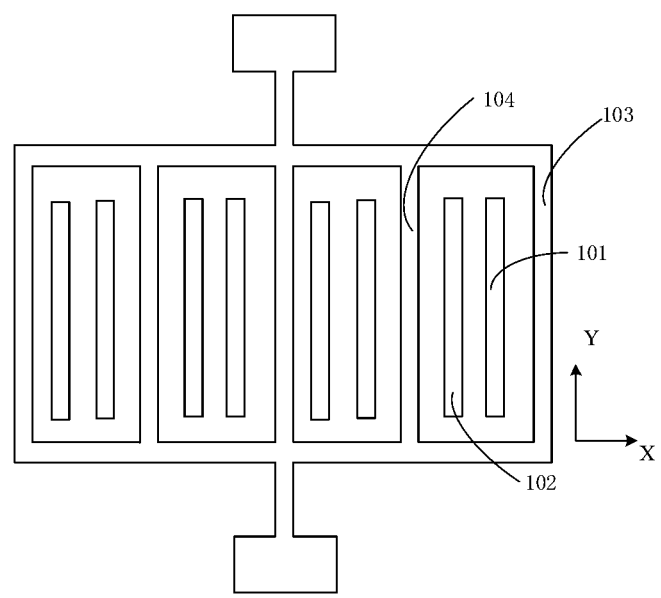
FIG. 1 is a schematic structure diagram of an X-axis sensor and a Y-axis sensor according to an embodiment of the invention.

In the embodiment of the invention, since the movable sensitive element of the inertial sensor is formed by using the first substrate and the sensitive film of the pressure sensor is formed by using the first substrate or one of the conductive layers on the first substrate, the formed integrated pressure sensor and inertial sensor has a small size, a low cost and a high reliability after packaging.

Moreover, in the embodiment of the invention, since the sensitive element of the inertial sensor is formed of monocrystalline semiconductor material, thicker movable sensitive element, i.e., the movable electrode, of the inertial sensor may be formed, increasing the mass of element. The sensitivity and reliability of the inertial sensor can be improved.

Further, in the embodiment of the invention, one or more conductive layers are formed on the first substrate, and the conductive layer may be used to form the electrical interconnecting layer for the inertial sensor and the pressure sensor, therefore the electrical interconnecting layer for the pressure sensor and the inertial sensor may be formed by using a common conductive layer, and the size of the integrated inertial sensor and pressure sensor is reduced.

Further, in the embodiment of the invention, besides the electrical interconnecting layer for the inertial sensor, the conductive layer may further include the first electrical shielding layer for the inertial sensor, the supporting post of the fixed electrode of the inertial sensor, the supporting post of the movable sensitive element of the inertial sensor or any combination thereof. Therefore, these materials may be used to form different structures of the pressure sensor, such as the sensitive film and/or the movable sensitive element or the fixed electrode of the pressure sensor. Thus, in one aspect, the size of the integrated inertial sensor and pressure sensor is reduced; and in another aspect, the manufacturing process becomes simpler, the flexibility for manufacturing the device is enhanced, the layout becomes easier, and the flexibility for integrating with other devices is improved.

In the embodiment of the invention, the electrical shielding layer is electrically connected with the shielding interconnecting line of the electrical interconnecting layer, and therefore the inertial sensor is prevented from being interfered by an external electrical signal.

In the embodiment of the invention, the pressure sensor may include one or more sensitive films, therefore the integrated pressure sensor and inertial sensor formed according to the embodiment of the invention can be used in the case that the pressure is relatively high, and can also be used in the case that the pressure is relatively low.

To achieve the above objects, the following technique solutions are provided according to the invention.

An integrated inertial sensor and pressure sensor is firstly provided according to an embodiment of the invention, and the integrated inertial sensor and pressure sensor includes: a first substrate, where the first substrate includes a first surface and a second surface opposite to the first surface, and the first substrate includes a first region and a second region;

at least one or more conductive layers, formed on the first surface of the first substrate;

a movable sensitive element of the inertial sensor, formed by using the first region of the first substrate;

a second substrate and a third substrate, where the second substrate is coupled to a surface of the conductive layer on the first surface of the first substrate; the third substrate is coupled to a side of the second surface of the first substrate in which the movable sensitive element of the inertial sensor is formed, and the third substrate and the second substrate are respectively arranged on two opposite sides of the movable sensitive element of the inertial sensor; and a sensitive film of the pressure sensor, including at least the second region of the first substrate, or including at least one of the conductive layers on the second region of the first substrate. The integrated inertial sensor and pressure sensor according to the invention includes the MEMS inertial sensor. The MEMS inertial sensor may be an acceleration sensor or a gyroscopic apparatus (which is also referred to as a gyroscope). No matter the MEMS inertial sensor is a gyroscopic apparatus or an acceleration sensor, the MEMS inertial sensor includes a sensor unit for signal conversion (for example, converting the acceleration or the angular rate of rotation into an electrical signal). The sensor unit includes a movable sensitive element (which is also referred to as a movable electrode), a fixed electrode, an electrical interconnecting layer for respectively leading the movable electrode and the fixed electrode, and supporting posts for respectively supporting the movable electrode and the fixed electrode. The sensor unit is the core of the MEMS inertial sensor. The movable electrode of the MEMS inertial sensor according to the invention is formed of monocrystalline semiconductor material.

Generally, the acceleration sensor includes an X-axis sensor, a Y-axis sensor, a Z-axis sensor or any combination thereof. A schematic top view of the structure of the X-axis sensor of the acceleration sensor according to an embodiment of the invention is shown in FIG. 1, and the X-axis sensor includes a fixed electrode and a movable electrode. The fixed electrode includes two adjacent fixed electrode fingers, i.e., a first fixed electrode finger 101 and a second fixed electrode finger 102. The movable electrode includes movable electrode fingers arranged in parallel, i.e., a first movable electrode finger 103 and a second movable electrode finger 104. The two ends of each of the movable electrode fingers are respectively connected to two movable connecting arms arranged in parallel (not shown). A movable electrode finger is arranged between every two adjacent fixed electrode fingers in a staggered way, therefore the first fixed electrode finger 101 and the first movable electrode finger 103 form a first capacitor, and the second fixed electrode finger 102 and the second movable electrode finger 104 form a second capacitor. When the movable electrode moves along the X axis, the distance between the two parallel plates of the capacitor will be changed, and the two capacitors changes in an opposite way, so the acceleration of the acceleration sensor in the X axis direction can be obtained by detecting the changed capacitance.

The acceleration sensor may further include a Y-axis sensor. As known by those skilled in the art, the Y-axis sensor has a similar structure to that of the X-axis sensor, which will not be described in detail herein.

Figure 2:
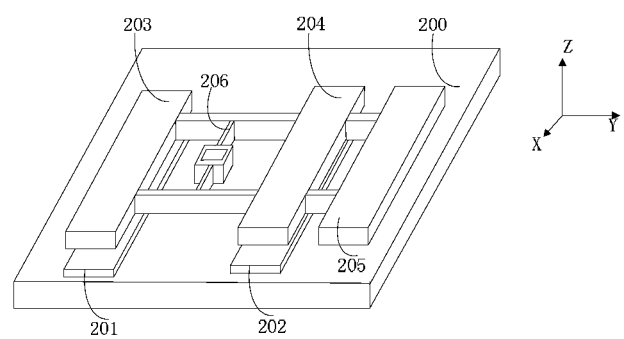
FIG. 2 is a schematic structure stereogram of a Z-axis sensor according to an embodiment of the invention.
Figure 3:
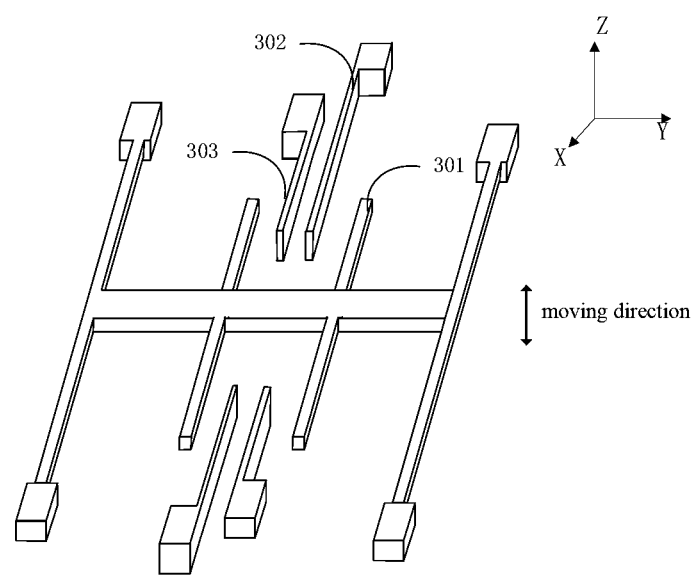
FIG. 3 is a schematic structure stereogram of a Z-axis sensor according to another embodiment of the invention.

The acceleration sensor may further include a Z-axis sensor. Referring to FIG. 2 and FIG. 3, the Z-axis sensor generally has two types of structures. Firstly, referring to FIG. 2, the Z-axis sensor includes a fixed electrode and a movable electrode. The fixed electrode includes a first fixed electrode 201 and a second fixed electrode 202. The movable electrode includes a first movable electrode 203 and a second movable electrode 204. The fixed electrode is fixed on a substrate 200. The movable electrode may move around a torsion spring 206. A seismic mass is further provided on the movable electrode. In this embodiment, a seismic mass 205 is provided on the outside of the second movable electrode 204, so the movable electrodes have an asymmetric structure with respective to the torsion spring 206. The fixed electrode and the movable electrode form two parallel plates of a capacitor. Under acceleration, the capacitance between the fixed electrode and the movable electrode will be changed, so the acceleration information of the acceleration sensor in the Z axis direction can be obtained by detecting the change of the capacitance.

FIG. 3 illustrates another Z-axis sensor, including a movable electrode and a fixed electrode. The movable electrode includes multiple movable electrode fingers 301. The middle of the multiple movable electrode fingers 301 are connected by a crossbar to form an integrated structure and may move up and down. The fixed electrode includes a first fixed electrode finger 302 and a second fixed electrode finger 303. The first fixed electrode finger 302 and the second fixed electrode finger 303 are disposed oppositely to the movable electrode fingers 301 to form two capacitors. When the movable electrode fingers 301 moves up and down, the capacitances of the capacitors formed between the movable electrode finger 301 and the first fixed electrode finger 302 and between the movable electrode finger 301 and the second fixed electrode finger 303 are changed, so the acceleration information in the Z axis direction can be obtained.

The above two Z-axis sensors have different structures and similar sensing principles, that is, the acceleration information in Z axis direction is sensed according to the change of the capacitance of the capacitor formed between the movable electrode and the fixed electrode. However, the difference between the two Z-axis sensors is that, the capacitance is changed by changing the distance between the two parallel plates of the capacitor in the structure shown in FIG. 2, and the capacitance is changed by changing the overlapping area between the two parallel plates of the capacitor in the structure shown in FIG. 3.

Figure 4:
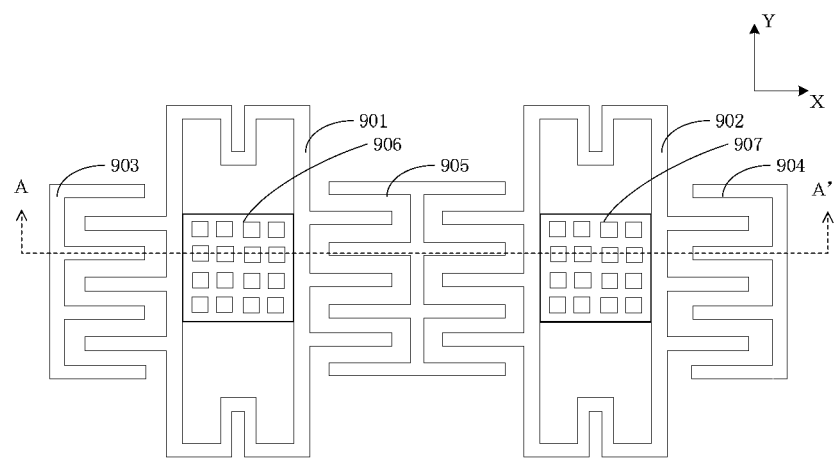
FIG. 4 is a schematic structure diagram of a gyroscopic apparatus according to an embodiment of the invention.
Figure 5:
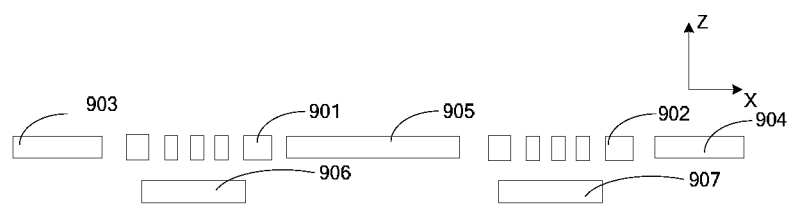
FIG. 5 is a schematic view of a sectional structure of a gyroscopic apparatus according to an embodiment of the invention.

FIG. 4 illustrates a schematic top view of the structure of a gyroscopic apparatus, and FIG. 5 illustrates a schematic view of the sectional structure taken along AA' in FIG. 4. The gyroscopic apparatus includes a movable electrode, a fixed electrode and a sensing electrode. Specifically, the movable electrode includes a first movable electrode 901 and a second movable electrode 902. The fixed electrode includes a first fixed electrode 903, a second fixed electrode 904 and a third fixed electrode 905, and the third fixed electrode 905 is provided between the first fixed electrode 903 and the second fixed electrode 904. The first movable electrode 901 is provided between the first fixed electrode 903 and the third fixed electrode 905. The second movable electrode 902 is provided between the second fixed electrode 904 and the third fixed electrode 905. Two interdigitated capacitors are respectively formed between the first movable electrode 901 and the first fixed electrode 903 and between the first movable electrode 901 and the third fixed electrode 905, and two interdigitated capacitors are respectively formed between the second movable electrode 902 and the second fixed electrode 904 and between the second movable electrode 902 and the third fixed electrode 905. When there is a potential difference between the first fixed electrode 903 and the first movable electrode 901, the first movable electrode 901 will move toward the first fixed electrode 903; and when there is a potential difference between the third fixed electrode 905 and the first movable electrode 901, the first movable electrode 901 will move toward the third fixed electrode 905; it is similar for the case between the second movable electrode 902 and the second fixed electrode 904 and between the second movable electrode 902 and the third fixed electrode 905. Therefore, under the action of an alternating current electrical signal, the first movable electrode 901 and the second movable electrode 902 will respectively move toward the first fixed electrode 903 or the second fixed electrode 904, or move toward the third fixed electrode 905.

The gyroscopic apparatus further includes a sensing electrode. The sensing electrode includes a first sensing electrode 906 and a second sensing electrode 907. The first sensing electrode 906 and the second sensing electrode 907 are respectively overlapped with the first movable electrode 901 and the second movable electrode 902, and there is an air cavity or medium between the sensing electrode and the movable electrode, referring to FIG. 5. A capacitor is formed between the sensing electrode and the movable electrode. When the first movable electrode 901 and the second movable electrode 902 move along the X axis, and the device rotates in the Y axis direction, the first movable electrode 901 and the second movable electrode 902 will move in the Z axis direction, and the capacitance of the capacitor formed between the sensing electrode and the movable electrode will be changed, so the angular rotation rate information can be sensed.

According to the invention, the integrated inertial sensor and pressure sensor further includes a MEMS pressure sensor. The MEMS pressure sensor generally includes a sensitive film of the pressure sensor and a fixed electrode of the pressure sensor. The sensitive film of the pressure sensor and the fixed electrode of the pressure sensor form a capacitor. The sensitive film of the pressure sensor is used to sense the external pressure, and is deformed under the action of the external pressure, so the capacitance of the capacitor will be changed, and the pressure information can be obtained. In this case, the sensitive film of the pressure sensor serves as the component for sensing the external pressure, and also serves as a movable sensitive element (i.e., a movable electrode). Generally, an additional movable electrode may further be provided between the sensitive film of the pressure sensor and the fixed electrode of the pressure sensor, and a connecting arm is provided between the movable electrode of the pressure sensor and the sensitive film of the pressure sensor. When the sensitive film of the pressure sensor is deformed, the movable electrode of the pressure sensor will move, then the capacitance between the movable electrode of the pressure sensor and the fixed electrode of the pressure sensor will be changed, and the pressure information can be obtained by measuring the capacitance between the movable electrode of the pressure sensor and the fixed electrode of the pressure sensor.

The integrated inertial sensor and pressure sensor according to the invention further includes other structures such as:

a first substrate for forming the movable sensitive element of the inertial sensor. The first substrate includes a first surface and a second surface. One or more conductive layers are formed on the first surface of the first substrate. The first substrate includes a first region and a second region. The second surface of the first substrate may be a surface after thinning the original thicker starting first substrate. The movable electrode of the inertial sensor is formed by using the thinned first substrate.

The integrated inertial sensor and pressure sensor may further include a second substrate. The second substrate is mainly used for mechanical support. The second substrate is coupled to the surface of the one or more conductive layers on the first substrate. If the one or more conductive layers include a first electrical shielding layer for the inertial sensor (the first electrical shielding layer is the conductive layer farthest from the first surface of the first substrate), the second substrate may be coupled to the surface of the first electrical shielding layer on the first substrate, no matter whether the one or more conductive layers include the electrical interconnecting layer for the inertial sensor and the pressure sensor. Further, if the second substrate is coupled to the first electrical shielding layer on the first substrate directly or via a conductive coupling layer, the second substrate and the first electrical shielding layer together serve as the electrical shielding layer for the inertial sensor. If the second substrate is coupled to the one or more conductive layers on the first substrate via a coupling layer and the coupling layer includes at least one insulating layer, the first electrical shielding layer solely serves as the electrical shielding layer for the inertial sensor.

The integrated inertial sensor and pressure sensor may further include a third substrate. The third substrate is coupled to one side of the second surface of the first substrate in which the movable sensitive element of the inertial sensor is formed. The third substrate and the second substrate are respectively arranged on two sides of the movable electrode of the inertial sensor. The third substrate is used to seal the movable electrode of the inertial sensor and the fixed electrode of the pressure sensor respectively, and may include a circuit and/or a lead.

In the embodiment of the invention, the first substrate is formed of semiconductor material. As an embodiment of the invention, the first substrate is formed of monocrystalline semiconductor material. For example, the first substrate is a monocrystalline semiconductor silicon substrate, or the first substrate is a monocrystalline semiconductor germanium substrate. The advantages of forming the first substrate by using the monocrystalline semiconductor material is that the movable sensitive element formed by using the first substrate can have a large thickness, so the movable sensitive element has a large thickness, thus the mass of the mass element is increased and the sensitivity of the inertial sensor is improved. In other embodiments, the first substrate may also be formed of other semiconductor materials such as amorphous silicon, polycrystalline silicon or germanium-silicon.

In the embodiment of the invention, the one or more conductive layers may include the first electrical shielding layer of the inertial sensor, the electrical interconnecting layers for the inertial sensor and the pressure sensor, the supporting post of the fixed electrode of the inertial sensor, the supporting post of the movable sensitive element of the inertial sensor or any combination thereof. The one or more conductive layers further include the supporting post of the fixed electrode of the pressure sensor, and the supporting post of the sensitive film and/or movable electrode of the pressure sensor. The structures of the two sensors (the inertial sensor and the pressure sensor) may be formed by using one or more conductive layers. Therefore, these materials may be fully utilized to form different structures of the pressure sensor and inertial sensor. Thus, in one aspect, the size of the integrated inertial sensor and pressure sensor is reduced; and in another aspect, the manufacturing process becomes easier, the flexibility for manufacturing the device is enhanced, the layout becomes easier, and the flexibility for integrating with other devices is enhanced.

In the embodiment of the invention, the electrical interconnecting layer includes one or more layers of interconnecting lines. The one or more layers of interconnecting lines are electrically connected to the fixed electrode, the movable electrode and the sensing electrode (the gyroscopic apparatus) of the inertial sensor and the fixed electrode, the sensitive film or the movable electrode of the pressure sensor respectively. Further, to reduce the size of the integrated inertial sensor and pressure sensor, the electrical interconnecting layer for the pressure sensor may be formed of the material for forming the electrical interconnecting layer for the inertial sensor, i.e., the electrical interconnecting layer for the inertial sensor and the electrical interconnecting layer for the pressure sensor may share the some material layers. The sensitive film and/or the movable electrode or the fixed electrode of the pressure sensor may even be formed by using the same material layer for forming the electrical interconnecting layer for the inertial sensor.

More preferably, the required structure of these sensors may be formed by sharing some conductive layer materials. For example, the sensitive film of the pressure sensor may be formed by using the material layer for forming the first electrical shielding layer for the inertial sensor, and the fixed electrode of the pressure sensor may be formed by using the material layer for forming the supporting post or electrical interconnecting layer for the inertial sensor. Alternatively, the sensitive film and the fixed electrode of the pressure sensor are respectively formed by using the materials layers of different layers of the supporting post or electrical interconnecting layer for the inertial sensor. The sensitive film may also be formed by using the material layer for forming the supporting post or electrical interconnecting layer for the inertial sensor, and the fixed electrode of the pressure sensor may be formed by using the first substrate. Furthermore, the sensitive film may be formed by using the material layer for forming the supporting post, the electrical interconnecting layer for the inertial sensor or the first electrical shielding layer for the inertial sensor, or by using the first substrate, and the fixed electrode of the pressure sensor may be formed by using the conductive material layer for forming the lead on the third substrate.

In the above embodiment, if no additional movable electrode of the pressure sensor is provided, the sensitive film may also serve as the movable electrode. According to practical need, an additional movable electrode of the pressure sensor may be provided. For example, in the case that the sensitive film of the pressure sensor is formed by using the material layer for forming the supporting post, the electrical interconnecting layer for the inertial sensor or the first electrical shielding layer for the inertial sensor, the movable electrode of the pressure sensor may be formed by using the material layer for forming different supporting post or electrical interconnecting layer for the inertial sensor. A connecting arm is connected between the sensitive film and the movable electrode of the pressure sensor. The connecting arm is mainly used to transfer the deformation of the sensitive film to the movable electrode of the pressure sensor, to make the movable electrode of the pressure sensor move, thus the capacitance between the movable electrode and the fixed electrode of the pressure sensor is changed.

The above technical solutions are only some examples, flexible layouts may be made by those skilled in the art according to the actual device and design requirement based on the idea of the invention, and the scope of protection of the invention should not be limited excessively herein.

In the embodiment of the invention, the supporting posts are used to fixedly support the fixed electrodes and the movable electrodes of the inertial sensor and the pressure sensor. The supporting posts generally provide electrically connecting the supporting arms of the movable electrode and the fixed electrode, and the fixing ends of the movable sensitive element and the fixed electrode.

If the one or more conductive layers include the first electrical shielding layer for the inertial sensor and the electrical interconnecting layer for the inertial sensor and the pressure sensor, the electrical interconnecting layer is closer to the first surface of the first substrate than the first electrical shielding layer. If the one or more conductive layers include only the first electrical shielding layer for the inertial sensor, the electrical interconnecting layer for the inertial sensor and the pressure sensor may be formed on the third substrate. In this case, the first electrical shielding layer may also serve as the sensitive film of the pressure senor. Therefore, these materials may be fully utilized to form different structures of the pressure sensor and the inertial sensor. Thus, in one aspect, the size of the integrated inertial sensor and pressure sensor is reduced; and in another aspect, the manufacturing process becomes easier, the flexibility for manufacturing the device is enhanced, the layout becomes easier, and the flexibility for integrating with other devices is enhanced.

In the invention, the movable electrodes and the fixed electrodes of the X-axis sensor and the Y-axis sensor of the inertial sensor are formed by using the thinned first substrate; and the Z-axis sensor can have the following different types, based on its structures.

If the Z-axis sensor has the structure as shown in FIG. 2, the fixed electrode of the Z-axis sensor is formed by using the one or more conductive layers. Preferably, if the one or more conductive layers include only the first electrical shielding layer, the fixed electrode of the Z-axis sensor is formed by using the material layer for forming the first electrical shielding layer. More preferably, if the one or more conductive layers include the electrical interconnecting layer, the fixed electrode of the Z-axis sensor is formed by using the material layer for forming the electrical interconnecting layer, no matter whether the one or more conductive layers include the first electrical shielding layer. Further preferably, the fixed electrode of the Z-axis sensor is formed by using the conductive material layer of the electrical interconnecting layer closest to the first substrate.

If the Z-axis sensor has the structure as shown in FIG. 3, the fixed electrode of the Z-axis sensor is formed by using the first substrate.

More preferably, an anti-stiction structure is further formed on the side of the fixed electrode or the movable electrode of the Z-axis sensor of the acceleration sensor, for preventing the movable sensitive element from being adhered to the fixed electrode when the movable sensitive element contacts with the fixed electrode. The anti-stiction structure may be formed of the conductive layer material or the insulating layer material. As a preferable embodiment of the invention, the anti-stiction structure is formed by using one or more conductive layers, or is formed by using the first substrate. Preferably, no matter the Z-axis sensor has the structure shown in FIG. 2 or has the structure shown in FIG. 3, the anti-stiction structure is formed by using one or more conductive layers, and more preferably, is formed by using the conductive layer closest to the first substrate.

In a case that the inertial sensor is a gyroscopic apparatus, the gyroscopic apparatus includes an X-axis gyroscopic apparatus, a Y-axis gyroscopic apparatus, a Z-axis gyroscopic apparatus, or any combination thereof, and the X-axis gyroscopic apparatus, the Y-axis gyroscopic apparatus and the Z-axis gyroscopic apparatus respectively refer to the gyroscopic apparatus for sensing the angular rates in the X axis, the Y axis and the Z axis directions. The gyroscopic apparatus further includes a sensing electrode and a fixed electrode. As an embodiment, the fixed electrode of the X-axis gyroscopic apparatus or the Y-axis gyroscopic apparatus is formed by using the first substrate, and the sensing electrode of the X-axis gyroscopic apparatus or the Y-axis gyroscopic apparatus is formed by using the one or more conductive layers. Both the fixed electrode and the sensing electrode of the Z-axis gyroscopic apparatus are formed by using the first substrate.

Preferably, if the one or more conductive layer is the electrical interconnecting layer for the gyroscopic apparatus, the sensing electrode of the X-axis gyroscopic apparatus or the Y-axis gyroscopic apparatus may be formed by using the material for forming the electrical interconnecting layer.

Preferably, if the one or more conductive layers include only the first electrical shielding layer, the sensing electrode of the X-axis gyroscopic apparatus or the Y-axis gyroscopic apparatus may be formed by using the material for forming the first electrical shielding layer.

The fixed electrode of the gyroscopic apparatus is formed by using the first substrate. Since the formed fixed electrode may have a great thickness, the stretching distance and the driving speed will be great in use, and thus the sensing sensitivity is high.

More preferably, an anti-stiction structure is formed on the side of the fixed electrode or the movable electrode of the X-axis gyroscopic apparatus or the Y-axis gyroscopic apparatus of the gyroscopic apparatus. Because the fixed electrode and the movable electrode of the X-axis gyroscopic apparatus or the Y-axis gyroscopic apparatus are formed by using the first substrate, the anti-stiction structure may be formed by using the first substrate or by using the one or more conductive layers.

In the invention, by forming one or more conductive layers on the first substrate, various sensors can be formed flexibly. Because the movable electrode of the inertial sensor is formed by using the first substrate, deficiencies caused by the MEMS inertial sensor formed by using polycrystalline silicon layer in the prior can be overcome, such as the deficiency of the limited thickness due to the stress of the polycrystalline silicon in the prior art can be overcome.

Similarly, for the gyroscopic apparatus, the movable electrode is formed by using the monocrystalline semiconductor substrate, so the formed movable electrode has a great thickness and a great mass, and thus the angular rate can be detected with high sensitivity.

In summary, in the embodiments of the invention, the movable sensitive element of the inertial sensor is formed by using the first substrate, and the sensitive film of the pressure sensor is formed by using the first substrate or by using one of the one or more conductive layers on the first substrate, therefore the formed integrated pressure sensor and inertial sensor has a small size, a low cost and a high reliability.

Figure 6:
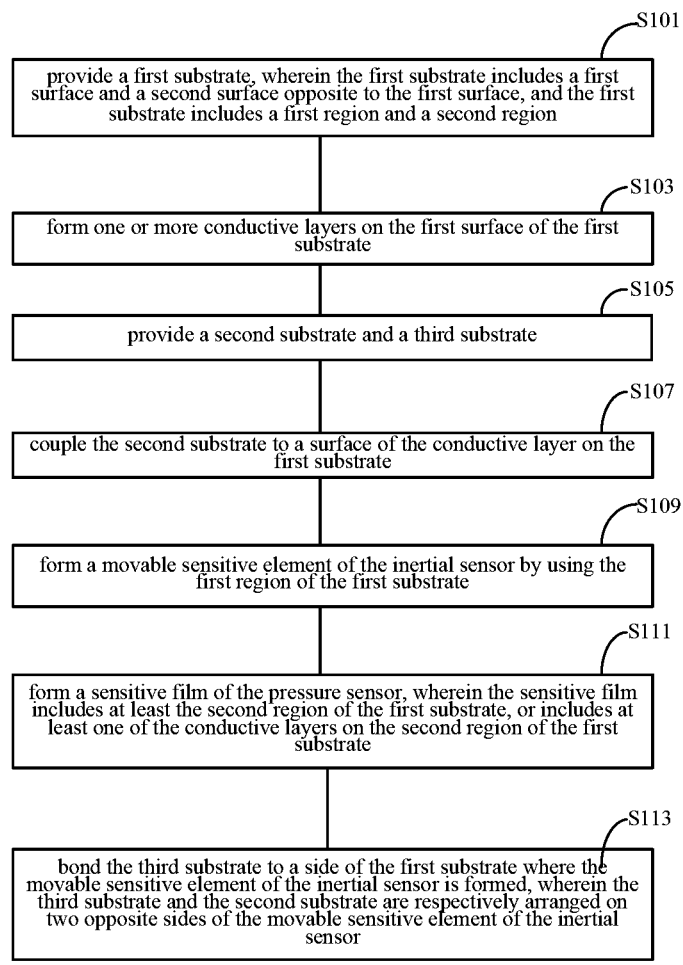
FIG. 6 is a flow chart of a method for forming an integrated inertial sensor and pressure sensor according to an embodiment of the invention.

Referring to FIG. 6, a flow chart of a method for forming the above integrated inertial sensor and pressure sensor is further provided according to an embodiment of the invention. The method includes: step S101, providing a first substrate, where the first substrate includes a first surface and a second surface opposite to the first surface, and the first substrate includes a first region and a second region; step S103, forming one or more conductive layers on the first surface of the first substrate; step S105, providing a second substrate and a third substrate; step S107, coupling the second substrate to a surface of the conductive layer on the first surface of the first substrate; step S109, forming a movable sensitive element of the inertial sensor by using the first region of the first substrate; step S111, forming a sensitive film of the pressure sensor, where the sensitive film includes at least the second region of the first substrate, or includes at least one of the conductive layers on the second region of the first substrate; and step S113, coupling the third substrate to a side of the second surface of the first substrate in which the movable sensitive element of the inertial sensor is formed, where the third substrate and the second substrate are respectively arranged on two opposite sides of the movable sensitive element of the inertial sensor.

Specifically, referring to FIGS. 7 to 16 which illustrate schematic views of sectional structures of a method for forming an integrated inertial sensor and pressure sensor according to an embodiment of the invention, respective descriptions will be made in detail below.

Figure 7:
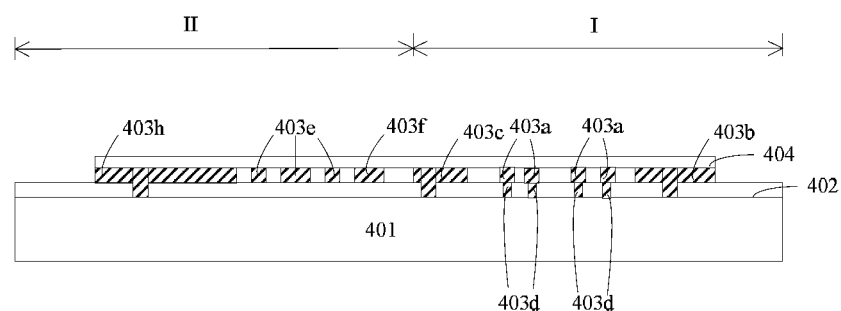
FIGS. 7 to 16 are schematic views of sectional structures of a method for forming an integrated inertial sensor and pressure sensor according to an embodiment of the invention.

Firstly, referring to FIG. 7, a first substrate 401 is provided. The first substrate 401 is a monocrystalline semiconductor substrate. The first substrate 401 includes a first surface and a second surface opposite to the first surface. The first substrate includes a first region I and a second region II. The first region I is used to form the inertial sensor, and the second region II is used to form the pressure sensor.

The first substrate 401 may be monocrystalline semiconductor material. For example, the first substrate 401 may be monocrystalline semiconductor material such as monocrystalline silicon or monocrystalline germanium-silicon. As an embodiment of the invention, the first substrate 401 is monocrystalline silicon or monocrystalline germanium. In other embodiments of the invention, the first substrate 401 may be other semiconductor materials such as germanium-silicon, amorphous silicon or polycrystalline silicon.

One or more conductive layers are formed on the first surface of the first substrate 401. In this embodiment, the one or more conductive layers serve as the electrical interconnecting layer for the inertial sensor and the pressure sensor and the movable electrode layer of the pressure sensor. The electrical interconnecting layer for the inertial sensor can be used to lead out the fixed electrode and the movable electrode of the inertial sensor. The movable electrode layer of the pressure sensor can be used to form the movable electrode of the pressure sensor. In this embodiment, the movable electrode layer of the pressure sensor and the electrical interconnecting layer for the inertial sensor share some material layers.

Specifically, the forming one or more conductive layers on the first surface of the first substrate 401 includes: forming a first insulating layer 402 on the first surface of the first substrate 401; and etching the first insulating layer 402 to form, in the first insulating layer 402, a first opening through which the movable electrode of the inertial sensor or the fixed electrode of the pressure sensor and the electrical shielding layer of the inertial sensor are led out after the it is filled with a conductive material later.

The first insulating layer 402 may be dielectric material such as silicon oxide, silicon nitride or silicon oxynitride. As an embodiment, the first insulating layer 402 is silicon oxide; a first conductive layer is formed on the first insulating layer 402, and the first opening is filled with the first conductive layer; the first conductive layer is etched to form the electrical interconnecting layer for the inertial sensor and the movable electrode layer of the pressure sensor, and the electrical interconnecting layer for the inertial sensor includes discrete interconnecting lines in the first region I for different purposes.

In this embodiment, the electrical interconnecting layer for the inertial sensor includes the following discrete interconnecting lines: an inertial fixed electrode interconnecting line 403a for leading out the fixed electrode of the inertial sensor, a first shielding interconnecting line 403b for leading out the structure of the inertial sensor needed to be connected to the electrical shielding layer, a first sub-interconnecting line 403c, and an inertial movable electrode interconnecting line for leading out the movable electrode of the inertial sensor (not shown in the figures).

In this embodiment, a supporting post 403d of the fixed electrode is further formed. The supporting post 403d also has a function of electrical connection and is electrically connected to the fixed electrode interconnecting line 403a. In this embodiment, the supporting post 403d of the fixed electrode is formed by using the material layer for forming the first conductive layer of the electrical interconnecting layer for the inertial sensor.

The following structures are formed in the second region II: a movable electrode 403e of the pressure sensor, a second sub-interconnecting line 403f, and a second shielding interconnecting line 403h for leading out the structure of the pressure sensor needed to be connected to the electrical shielding layer.

A through hole is formed in the movable electrode 403e of the pressure sensor for releasing the structure later. The movable electrode 403e is shown to have a discrete structure, but actually, the movable electrode 403e also has a connected structure in other place.

The first conductive layer may be formed of doped polycrystalline silicon or other conductive materials. As an embodiment of the invention, the first conductive layer is polycrystalline silicon. If the first conductive layer is polycrystalline silicon, doping needs to be performed on the first conductive layer.

In practical manufacturing process, an electrical interconnecting layer for the pressure sensor also needs to be formed, but since the electrical interconnecting layer for the pressure sensor has a similar structure to that of the inertial sensor, it will not be described or illustrated in detail herein. Further, the electrical interconnecting layer for the pressure sensor, the supporting post of the movable electrode of the pressure sensor and the electrical interconnecting layer for the inertial sensor may be formed by using different conductive layers, and may also share same conductive layers by means of reasonable layout. How to form these structures by means of reasonable layout is known by those skilled in the art.

Further, in practical manufacturing process, the supporting posts of the movable electrode and the fixed electrode of the pressure sensor and the supporting post of the movable electrode of the inertial sensor also need to be formed, the structures and forming methods thereof are not described or illustrated one by one herein, and how to form these structures is known by those skilled in the art based on the ordinary technique in the art and the invention.

Further, the number of the electrical interconnecting layers for the inertial sensor and the pressure sensor may be generally more than one, and only one electrical interconnecting layer is shown as an example for illustration herein. The method for forming multiple electrical interconnecting layers is similar to the method described therein, and it should be noted that the scope of protection of the invention should not be limited excessively.

Then a second insulating layer 404 is formed on the electrical interconnecting layer and the movable electrode layer. Intervals among the discrete interconnecting lines of the electrical interconnecting layer for the inertial sensor and the through hole in the movable electrode of the pressure sensor are filled with the second insulating layer 404. The second insulating layer 404 may be formed of dielectric material such as silicon oxide, silicon nitride or silicon oxynitride. As an embodiment of the invention, the second insulating layer 404 and the first insulating layer 402 are formed of the same material which is silicon oxide.

Figure 8:
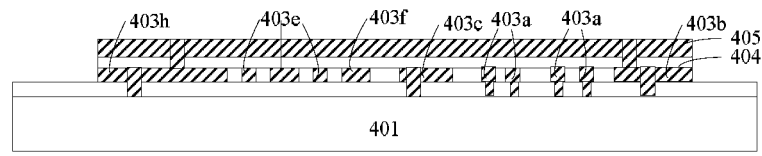

Referring to FIG. 8, a second conductive layer 405 is formed on the second insulating layer 404. The second conductive layer 405 in the first region I serves as the first electrical shielding layer of the inertial sensor in the first region I. The first electrical shielding layer is used for coupling to an electrical shielding signal. The electrical shielding signal may be a grounding signal, a direct current driving signal or other driving signals. In the invention, the electrical shielding signal accessed by the electrical shielding layer may be designed by the designer, and thus it is flexible in design.

Further, in this embodiment, the sensitive film of the pressure sensor is formed by using the second conductive layer 405 in the second region II. The material serving as the electrical shielding layer generally does not need to be patterned. In the invention, the pressure sensor and the inertial sensor are integrated, and in order to further reduce the size of the integrated device, the sensitive film of the pressure sensor and/or the movable electrode of the pressure sensor is formed by using the electrical shielding layer of the inertial sensor, and thus the second conductive layer 405 (i.e., the electrical shielding layer for forming the inertial sensor) needs to be photolithographically patterned and etched to form the required pattern and electrical structure, such as the required sensitive film of the pressure sensor and/or movable electrode of the pressure sensor.

The second conductive layer 405 may be doped polycrystalline silicon or other conductive materials. As an embodiment of the invention, the second conductive layer 405 is formed of polycrystalline silicon, and then the method further includes a step of doping the polycrystalline silicon, which will not be described in detail herein.

After the second conductive layer 405 is formed, a third insulating layer (not shown in the figures) may be formed on the second conductive layer 405. The third insulating layer serves as a coupling layer in the subsequent coupling process with the second substrate. The third insulating layer is generally formed of silicon oxide.

Figure 9:

Referring to FIG. 9, a second substrate 501 is provided. The second substrate 501 is mainly used for mechanical support. The second substrate 501 may be monocrystalline semiconductor material. For example, the second substrate 501 may be monocrystalline silicon or monocrystalline germanium-silicon. The second substrate 501 may also be other materials. As an embodiment of the invention, the second substrate 501 is monocrystalline silicon.

A fourth insulating layer (not shown in the figures) may further be formed on the second substrate 501. The fourth insulating layer serves as a coupling layer in the subsequent coupling process with the first substrate, for increasing the coupling force therebetween. The fourth insulating layer is preferably silicon oxide. Only one of the fourth insulating layer and the above-mentioned third insulating layer may be formed, or both of the two insulating layers may be formed, or neither of the two insulating layers is formed. Further, the coupling layer between the first substrate and the second substrate 501 may be formed of conductive material such as polycrystalline silicon, and it is noted that the scope of protection of the invention should not be limited excessively.

Figure 10:
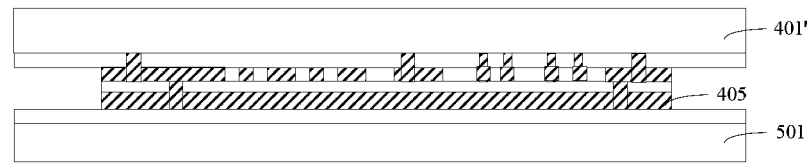

Then, referring to FIG. 10, the second substrate 501 is bonded to the surface of the first substrate on which the first electrical interconnecting layer and the second electrical interconnecting layer are formed. The first substrate and the second substrate 501 are combined into a MEMS wafer. The technique for bonding the second substrate 501 to the first substrate is known in the art, which will not be described in detail herein.

As described above, the second substrate 501 may be bonded to the first electrical shielding layer of the first substrate directly or via a coupling layer. If the second substrate 501 is bonded to the first electrical shielding layer of the first substrate directly or via a conductive coupling layer, i.e., no other material layer or only a conductive coupling layer is formed between the second substrate 501 and the first electrical shielding layer of the first substrate, the first electrical shielding layer and the second substrate 501 together serve as the electrical shielding layer of the inertial sensor; and if the second substrate 501 is bonded to the first electrical shielding layer of the first substrate via a coupling layer which includes at least one electrical insulating layer, for example, a fourth insulating layer is formed on the second substrate 501 or a third insulating layer is formed on the first electrical shielding layer, the first electrical shielding layer solely serves as the electrical shielding layer of the inertial sensor, which is specially noted herein. In this embodiment, a coupling layer is provided between the first substrate 401 and the second substrate 501, and the coupling layer is an insulating layer.

Further, it is to be noted that before the second substrate 501 is bonded to the first substrate, the two bonding surfaces need to be polished. For example, the third insulating layer (if a third insulating layer is formed on the first electrical shielding layer) or the first electrical shielding layer on the first substrate is polished. If a fourth insulating layer is formed on the second substrate 501, the fourth insulating layer may also need to be polished. The first and second substrates are subsequently coupled or bonded together.

Then, the first substrate is thinned, from the second surface of the first substrate on which no electrical interconnecting layer is formed, to 5 μm to 100 μm, and a first substrate 401' is formed after the thinning process. Then, the thinned first substrate 401' is used to form the movable electrode of the inertial sensor and the fixed electrode of the pressure sensor of the invention.

Figure 11:
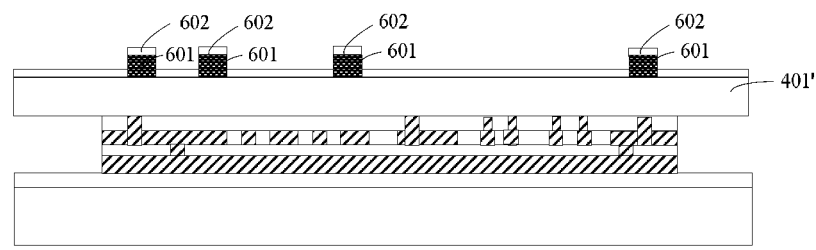

Referring to FIG. 11, a first adhering layer is formed on the first substrate 401'. The first adhering layer is used to form an adhering pad for coupling to the third substrate.

The first adhering layer is formed of conductive material. For example, the conductive material may be metal, metal alloy or other conductive materials, and may further be Al, Cu, silicon, germanium, aurum, tin or any alloy thereof.

Then, the first adhering layer is etched, for removing the adhering layer in the region not adhering to the third substrate, to expose part of the surface of the first substrate 401', and form a first adhering pad 601.

A first mask layer 602 is formed on the first adhering pad 601 and the exposed first substrate 401'. The first mask layer 602 may be formed of photoresist, silicon oxide, silicon nitride or the like. The first mask layer 602 serves as a mask in the subsequent process of etching the first substrate 401'.

Figure 12:
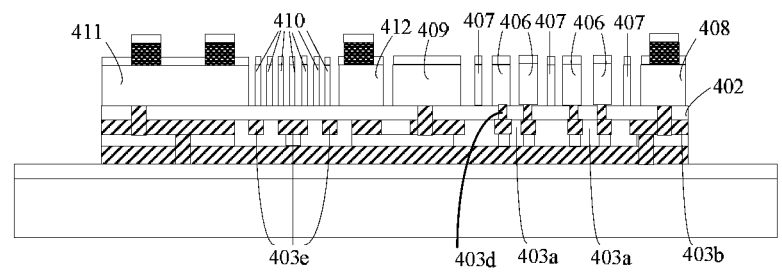

Referring to FIG. 12, the first mask layer 602 is patterned, and the pattern to be transferred is transferred to the first mask layer 602.

Then, the first substrate 401' is etched by using the patterned first mask layer 602 as a mask, until the first insulating layer 402 is exposed. By this step, the primary structures of the movable electrode and the fixed electrode of the inertial sensor and the fixed electrode of the pressure sensor are formed.

Specifically, a fixed electrode 406 of the inertial sensor, a movable electrode 407 of the inertial sensor, a first sealing sensor structure 408 and a first inertial sensor structure 409 are formed in the first region I. The fixed electrode 406 of the inertial sensor is electrically coupled to the inertial fixed electrode interconnecting line 403a. The movable electrode 407 of the inertial sensor is electrically coupled to an inertial movable electrode interconnecting line (not shown in the figures). The fixed electrode 406 of the inertial sensor and the movable electrode 407 of the inertial sensor have interval therebetween and are arranged correspondingly. The first sealing sensor structure 408 is electrically coupled to the first shielding interconnecting line 403b.

Specifically, a fixed electrode 410 of the pressure sensor, a second sealing sensor structure 411 and a first pressure sensor structure 412 are formed in the second region II. The position of the fixed electrode 410 of the pressure sensor corresponds to the position of the movable electrode 403e of the pressure sensor.

In this step, a through hole is further formed in the fixed electrode 410 of the pressure sensor, for releasing the structure later. Although the fixed electrode 410 of the pressure sensor is shown to have a discrete structure, it is actually an integrated structure, and has a connected structure in place not shown.

It can be seen from the above that both the fixed electrode of the inertial sensor and the movable electrode of the inertial sensor are formed by using the thinned first substrate; and the fixed electrode 410 of the pressure sensor is formed by using the thinned first substrate.

The fixed electrode 410 of the pressure sensor and the movable electrode 403e of the pressure sensor form two parallel plates of a capacitor. When the movable electrode of the pressure sensor moves, the distance between the two parallel plates of the capacitor is changed.

Figure 13:
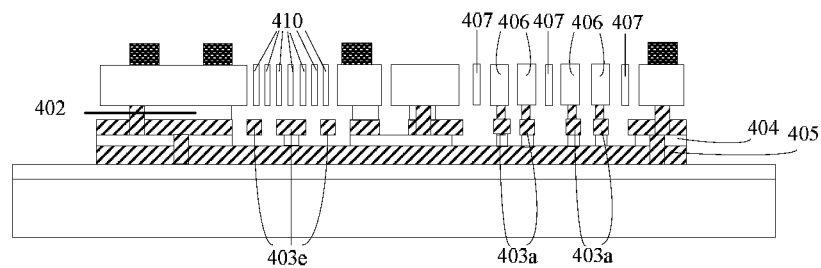
Figure 14:
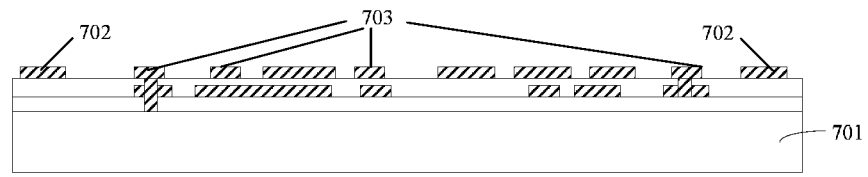

Referring to FIG. 13, part of the first insulating layer and part of the second insulating layer are removed, to release the structures of the movable electrode of the pressure sensor and the movable electrode of the inertial sensor. Due to the interval between the movable electrode 407 of the inertial sensor and the fixed electrode 406 of the inertial sensor, the first insulating layer 402 under the movable electrode 407 of the inertial sensor is completely removed, so as to release the movable electrode 407 of the inertial sensor and form the movable electrode 407 of the inertial sensor which can be movable. When the movable electrode 407 of the inertial sensor moves (to the left or the right), the distance between the movable electrode 407 of the inertial sensor and the fixed electrode 406 of the inertial sensor is changed. A fifth air cavity is formed between the movable electrode 407, the fixed electrode 406 and the inertial fixed electrode interconnecting line 403a of the inertial sensor. The intervals among the fifth air cavity, the movable electrode 407 of the inertial sensor and fixed electrode 406 of the inertial sensor are in communication with one another.

Further, the interconnecting lines of the electrical interconnecting layer for the inertial sensor are discrete, and in this embodiment, the second insulating layer 404 is formed of the same material as that of the first insulating layer 402, therefore part of the second insulating layer 404 is also removed.

Further, a through hole is formed in the fixed electrode 410 of the pressure sensor, thus the first insulating layer 402 between the fixed electrode 410 of the pressure sensor and the movable electrode 403e of the pressure sensor is also removed, and a second air cavity is formed. Further, a through hole is formed in the movable electrode 403e of the pressure sensor, thus the second insulating layer 404 between the movable electrode 403e of the pressure sensor and the second conductive layer 405 for forming the first electrical shielding layer of the inertial sensor (the second conductive layer in the second region servers as the sensitive film of the pressure sensor) is also removed, and a first air cavity is formed. However, the second insulating layer 404 herein is not removed completely, and a connecting arm is formed between the second conductive layer and the movable electrode 403e of the pressure sensor, for connecting the second conductive layer with the movable electrode 403e of the pressure sensor. In this embodiment, the connecting arm is formed of insulating material. The connecting arm may also be formed of conductive material, as long as the conductive material is formed in advance at the position where the connecting arm is to be formed, and the formation is known by those skilled in the art, which will not be described in detail herein.

The first air cavity, the through hole on the movable electrode 403e of the pressure sensor, the second air cavity and the through hole on the fixed electrode 410 of the pressure sensor are in communication with one another. The movable electrode 403e of the pressure sensor and the fixed electrode 410 of the pressure sensor form two parallel plates of a capacitor. When the movable electrode 403e of the pressure sensor is deformed, the distance between the two parallel plates of the capacitor is changed.

After this step, the movable electrode of the pressure sensor and the movable electrode of the inertial sensor are released.

In removing part of the first insulating layer and the part of the second insulating layer, the remained first mask layer is also removed.

The etching agent for removing part of the first insulating layer and part of the second insulating layer is selected based on the material of the first insulating layer and the second insulating layer. As an embodiment of the invention, the first insulating layer and the second insulating layer are silicon oxide, and the etching agent for removing the part of the first insulating layer and the part of the second insulating layer may be selected to be hydrofluoric acid. By controlling the etching time and the concentration of the etching solution, the amount of the first insulating layer and the second insulating layer to be remained can be controlled.

By the above processes, the core of the integrated pressure sensor and inertial sensor according to the invention is formed. A third substrate further needs to be formed later to cover the sensor, for sealing the fixed electrode and movable electrode of the inertial sensor, referring to FIG. 14. A third substrate 701 is provided. Various interconnecting structures (not marked) may be formed on the third substrate 701, and various CMOS circuits (not shown) and/or leads (not marked) may be formed in the third substrate 701. Further, a second adhering pad 703 and a bonding pad 702 are further formed on the surface of the third substrate 701. The second adhering pad 703 is used to subsequently couple to the side of the second surface of the first substrate in which the fixed electrode of the pressure sensor and the movable electrode of the inertial sensor are formed. The bonding pad 702 is used to electrically connect to the external circuit.

Figure 15:
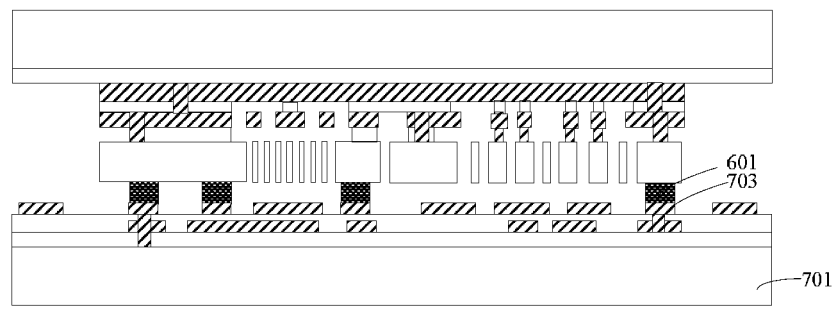

Referring to FIG. 15, the third substrate 701 is coupled to one side of of the second surface of the first substrate in which the fixed electrode of the pressure sensor and the movable electrode of the inertial sensor are formed. The third substrate 701 and the second substrate are respectively arranged on two opposite sides of the movable electrode of the inertial sensor. In this step, the second adhering pad 703 of the third substrate 701 is adhered to the first adhering pad 601 on the first substrate. The first adhering pad 601 and the second adhering pad 703 also function as the electrode. The interconnecting structures on the first substrate which is to be electrically connected to the third substrate and the electrode of the circuit are led out via the first adhering pad 601, and are electrically connected, via the second adhering pad 703, to the interconnecting structure and the circuit on the third substrate.

Figure 16:
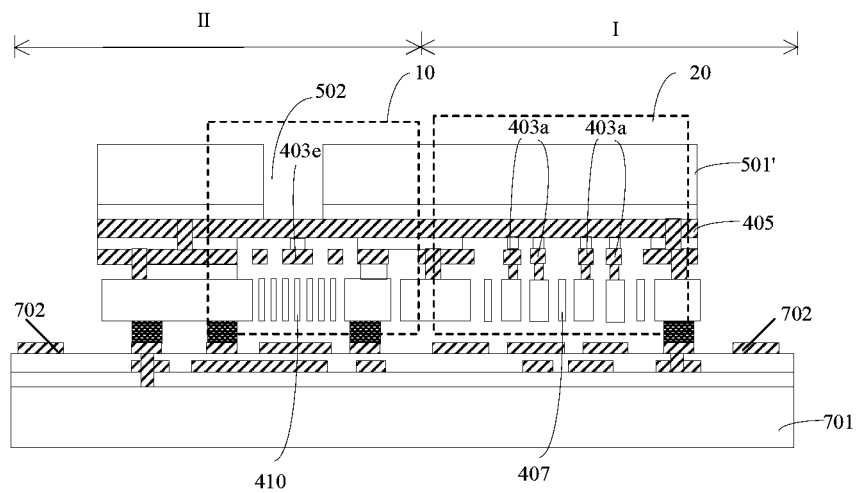

Then, referring to FIG. 16, a pressure port opening 502 is formed in the second substrate corresponding to the second region in which the pressure sensor is formed. The pressure port opening 502 serves as an entry for applying the pressure to the pressure sensor. The second conductive layer 405 is exposed through the pressure port opening 502. The second conductive layer 405 in the first region I forms the first electrical shielding layer of the inertial sensor, and the second conductive layer 405 in the second region II serves as the sensitive film of the pressure sensor, therefore the external pressure can be transferred to the movable electrode of the pressure sensor via the sensitive film.

The bonding pad 702 on the third substrate is covered by the second substrate, so in order to expose the bonding pad 702 on the third substrate, the second substrate covering the bonding pad 702 needs to be removed. As a preferred embodiment of the invention, the second substrate covering the bonding pad 702 is removed while the pressure port opening 502 is formed, and a second substrate 501' is formed, on which the bonding pad 702 on the third substrate is exposed, referring to FIG. 16. In the embodiment of the invention, the bonding pad 702 is exposed while the pressure port opening 502 is formed, thus the processing steps are simplified and the processing cost is reduced.

In this embodiment, a CMOS circuit and a lead are formed in the third substrate. The third substrate may also include none of these structures, or includes one of these structures. Other types of the third substrate may also be adopted. How to seal the formed movable electrode of the inertial sensor and the fixed electrode of the pressure sensor based on the type of the third substrate is known by those skilled in the art, and how to arrange the one or more conductive layers formed on the first substrate based on the type of the third substrate is also known by those skilled in the art, which will not be described in detail herein.

By the above processes, the integrated inertial sensor and pressure sensor according to the first embodiment of the invention is formed. In FIG. 16, the dashed box 10 indicates the formed pressure sensor, and the dashed box 20 indicates the formed inertial sensor. Specifically, the integrated inertial sensor and pressure sensor includes the movable electrode 407 of the inertial sensor and the fixed electrode 410 of the pressure sensor; the second substrate 501' and the third substrate 701. The movable electrode 407 of the inertial sensor and the fixed electrode 410 of the pressure sensor are arranged between the second substrate 501' and the third substrate 701. The movable electrode 407 of the inertial sensor 20 is formed by using the first substrate. The fixed electrode 410 of the pressure sensor is formed by using the first substrate. The first substrate is monocrystalline semiconductor material. The first substrate includes a first surface and a second surface. The first substrate includes a first region and a second region. One or more conductive layers are formed in the first region and the second region of the first surface of the first substrate. The second substrate is coupled to the surface of the one or more conductive layers on the first substrate. The third substrate is coupled to one side of the second surface of the first substrate in which the movable electrode 407 of the inertial sensor and the fixed electrode 410 of the pressure sensor are formed. A sixth air cavity and a seventh air cavity are respectively formed between the third substrate 701 and the movable electrode 407 of the inertial sensor and between the third substrate 701 and the fixed electrode 410 of the pressure sensor.

In this embodiment, the one or more conductive layers on the first surface of the first substrate include a first electrical shielding layer for the inertial sensor and an electrical interconnecting layer for the inertial sensor and the pressure sensor. The first electrical shielding layer is farther from the first substrate than the electrical interconnecting layer.

In this embodiment, the first conductive layer for forming the first electrical shielding layer for the inertial sensor is exposed through the pressure port opening. The exposed first conductive layer serves as the sensitive film of the pressure sensor 10. The pressure sensor 10 further includes the movable electrode 403e of the pressure sensor. The movable electrode 403e of the pressure sensor is formed of the material for forming the first electrical interconnecting layer for the inertial sensor. Specifically, in this embodiment, the movable electrode 403e of the pressure sensor is formed by using the same material layer as the fixed electrode interconnecting layer for forming the X-axis sensor or the Y-axis sensor. A through hole is formed in the movable electrode 403e of the pressure sensor. A first air cavity is formed between the sensitive film and the movable electrode 403e of the pressure sensor, and the sensitive film is connected with the movable electrode 403e of the pressure sensor via a connecting arm. Under the action of an external pressure, the sensitive film will move (in the direction perpendicular to the first electrical shielding layer), so as to drive the movable electrode 403e of the pressure sensor to move.

The pressure sensor further includes a fixed electrode 410 of the pressure sensor which is provided oppositely to the movable electrode 403e of the pressure sensor. A through hole is formed in the fixed electrode 410 of the pressure sensor. There is an interval between the movable electrode 403e of the pressure sensor and the fixed electrode 410 of the pressure sensor, for forming a second air cavity. The first air cavity, the through hole on the movable electrode 403e of the pressure sensor, the second air cavity and the through hole on the fixed electrode 410 of the pressure sensor are in communication with one another. The movable electrode 403e of the pressure sensor and the fixed electrode 410 of the pressure sensor form two parallel plates of a capacitor. When the movable electrode 403e of the pressure sensor moves, the distance between the two parallel plates of the capacitor is changed.

Figure 17:
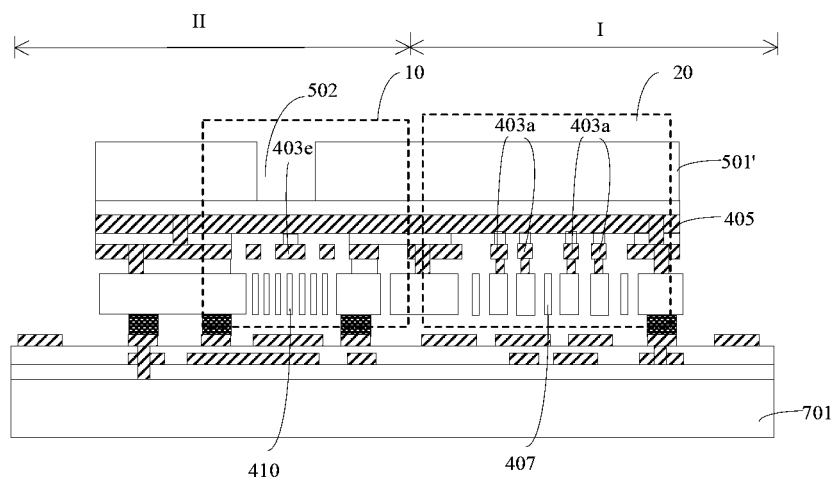
FIGS. 17 to 25 are schematic views of sectional structures of an integrated inertial sensor and pressure sensor according to a second embodiment to a tenth embodiment of the invention.

A second embodiment of the integrated inertial sensor and pressure sensor is further provided according to the present invention, and referred to in FIG. 17. The structure shown in FIG. 17 differs from the structure shown in FIG. 16 in that the coupling layer between the first substrate and the second substrate is exposed through the pressure port opening 502, and the second conductive layer and the coupling layer in the second region II together serve as the sensitive film of the pressure sensor. In this embodiment, the coupling layer is an insulating layer, and can protect the second conductive layer.

The sensitive film may also be formed of other conductive materials and insulating layers in combination, and may have other variations in the following embodiments. Further, the sensitive film may include more material layers, as long as the sensitive film includes one conductive layer and can be deformed under the action of external force.

The method for forming the integrated inertial sensor and pressure sensor as shown in FIG. 17 differs from the method for forming the structure as shown in FIG. 16 in that the forming of the pressure port opening 502 is ended at the coupling layer, and how to implement flexibly is known by those skilled in the art.

Figure 18:
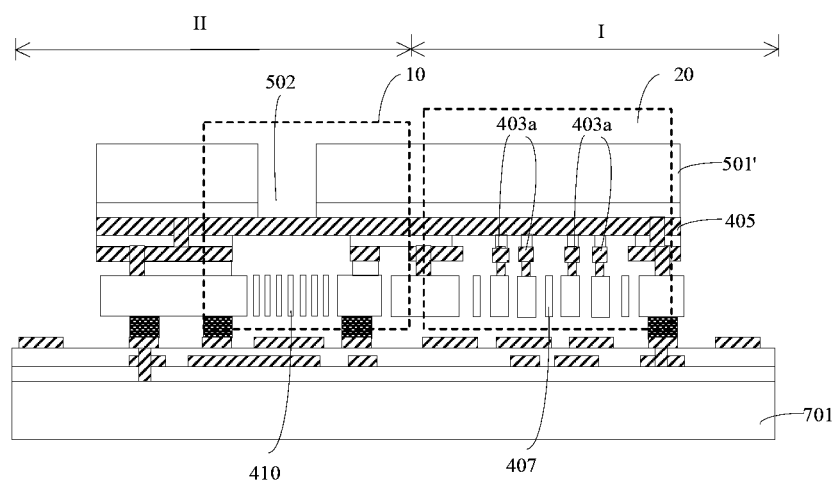

A third embodiment of the integrated inertial sensor and pressure sensor is further provided according to the invention, and FIG. 18 is referred to. The structure shown in FIG. 18 differs from the structure shown in FIG. 16 in that the second conductive layer for forming the first electrical shielding layer of the inertial sensor is exposed through the pressure port opening 502, and no additional movable electrode of the pressure sensor is formed, i.e., the exposed second conductive layer serves not only as the sensitive film of the pressure sensor but also the movable electrode of the pressure sensor. All the conductive layers between the fixed electrode and the sensitive film of the pressure sensor are removed, and a third air cavity is formed. The third air cavity, the through hole in the fixed electrode of the pressure sensor, and the seventh air cavity are in communication with one another. The sensitive film of the pressure sensor and the fixed electrode of the pressure sensor form two parallel plates of a capacitor. When the sensitive film of the pressure sensor is deformed, the distance between the two parallel plates of the capacitor is changed.

Specifically, the method for forming the integrated inertial sensor and pressure sensor as shown in FIG. 18 may include the following steps. In forming the electrical interconnecting layer for the inertial sensor, the conductive layers forming the interconnecting layer for the inertial sensor are removed by etching at the position corresponding to the fixed electrode of the pressure sensor, so that in removing the insulating layer between the sensitive film of the pressure sensor and the fixed electrode of the pressure sensor when the structure is released, a third air cavity is formed between the sensitive film and the fixed electrode of the pressure sensor.

Figure 19:
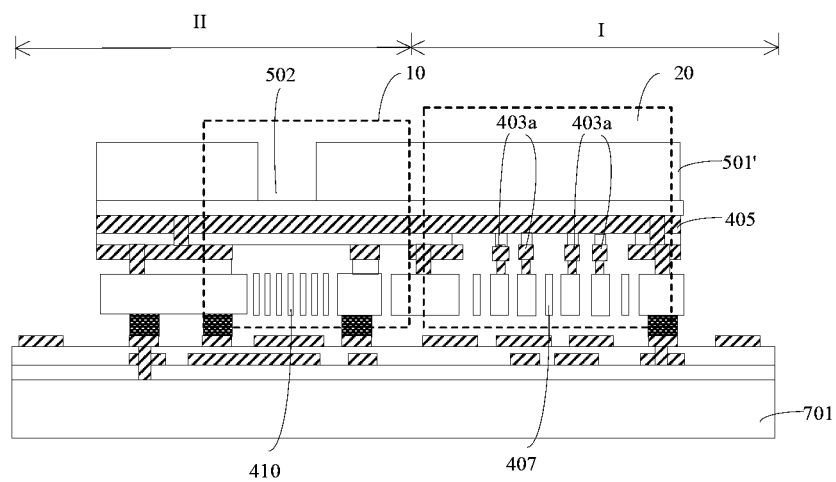

A fourth embodiment of the integrated inertial sensor and pressure sensor is further provided according to the invention, and referred to in FIG. 19. The integrated inertial sensor and pressure sensor shown in FIG. 19 differs from that shown in FIG. 18 in that the coupling layer is exposed through the pressure port opening, the coupling layer, the second conductive layer 405 and the second insulating layer in the second region II together serve as the sensitive film of the pressure sensor. Similarly, the method for forming the integrated inertial sensor and pressure sensor of this embodiment may refer to the above method, which will not be described in detail herein.

Figure 20:
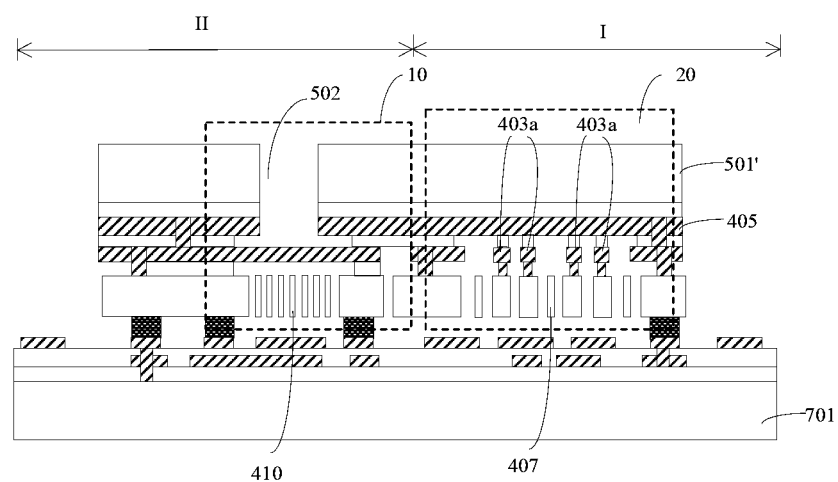

A fifth embodiment of the integrated inertial sensor and pressure sensor is further provided according to the invention, and is referred to in FIG. 20. The integrated inertial sensor and pressure sensor shown in FIG. 20 differs from that shown in FIG. 18 in that the conductive layer for forming the fixed electrode interconnecting line of the X-axis sensor or Y-axis sensor of the inertial sensor is exposed through the pressure port opening 204 formed in the second substrate 501', the sensitive film of the pressure sensor is formed by using this material layer in the second region II, and the movable electrode of the pressure sensor can be deformed under the action of external pressure.

Specifically, the method for forming the integrated inertial sensor and pressure sensor as shown in FIG. 20 is similar to the method for forming the integrated inertial sensor and pressure sensor as shown in FIG. 18, and the difference is that when forming the electrical interconnecting layer for the inertial sensor, the conductive layer for forming the sensitive film of the pressure sensor is formed at the position corresponding to the fixed electrode of the pressure sensor, no through hole is formed in the second conductive layer in the second region II, and after the conductive layer serving as the first electrical shielding layer for the inertial sensor is formed, the second conductive layer at the position corresponding to the pressure port opening of the pressure sensor to be formed is removed according to the size and position of the pressure port opening, or the second conductive layer at the position corresponding to the pressure port opening is removed when the pressure port opening is formed, so as to expose the conductive layer for forming the electrical interconnecting layer for the inertial sensor, for serving as the sensitive film of the pressure sensor. In this embodiment, no additional movable electrode of the pressure sensor is formed.

Figure 21:
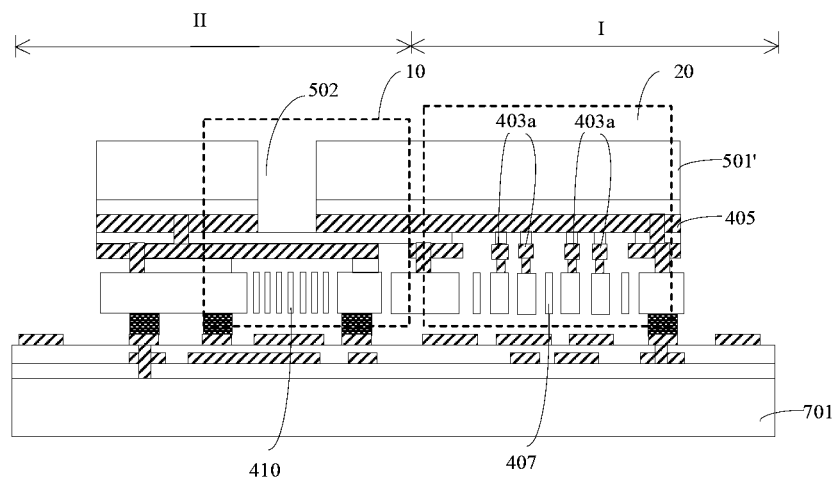

A sixth embodiment of the integrated inertial sensor and pressure sensor is further provided according to the invention, and is referred to in FIG. 21. The structure shown in FIG. 21 differs from the above structure shown in FIG. 20 in that the second insulating layer in the second region II and the conductive layer for forming the electrical interconnecting layer for the inertial sensor together serve as the sensitive film of the pressure sensor. In this embodiment, no additional movable electrode of the pressure sensor is formed. The method for forming the structure as shown in FIG. 21 is similar to the method for forming the above structure, which will not be described in detail herein.

Figure 22:
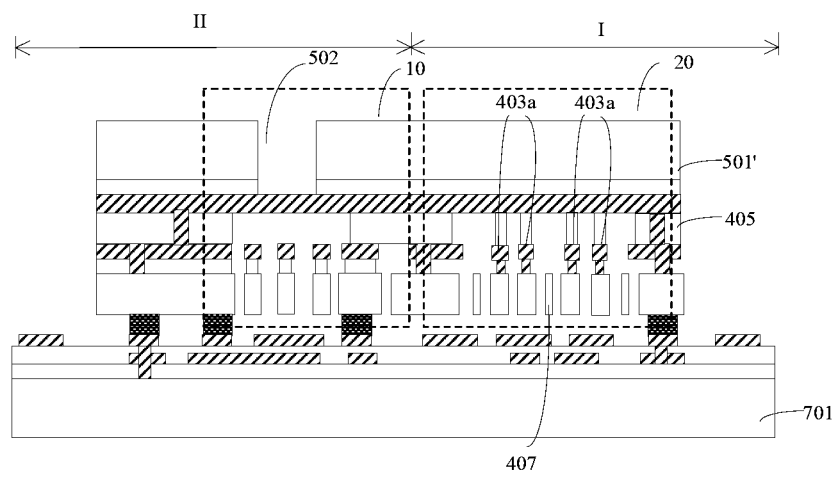

A seventh embodiment of the integrated inertial sensor and pressure sensor is further provided according to the invention, and is referred to in FIG. 22. The structure shown in FIG. 22 differs from the above structure shown in FIG. 20 in that the sensitive film and the fixed electrode of the pressure sensor are respectively formed by using the second conductive layer in the second region II and the first conductive layer in the second region II, i.e., in this embodiment, the sensitive film and the fixed electrode of the pressure sensor are respectively formed by using the conductive materials layers for forming the first electrical shielding layer and the electrical interconnecting layer for the inertial sensor, and no additional movable electrode of the pressure sensor is formed. To form a air cavity between the sensitive film and the fixed electrode of the pressure sensor, a through hole is formed in the first substrate, the first insulating layer and the first conductive layer, and the method for forming the structure as shown in FIG. 22 is similar to the method for forming the above structure, which will not be described in detail herein. As a variation of this embodiment, the sensitive film and the fixed electrode of the pressure sensor may be formed by using the conductive material layers for forming different electrical interconnecting layers for the inertial sensor.

Figure 23:
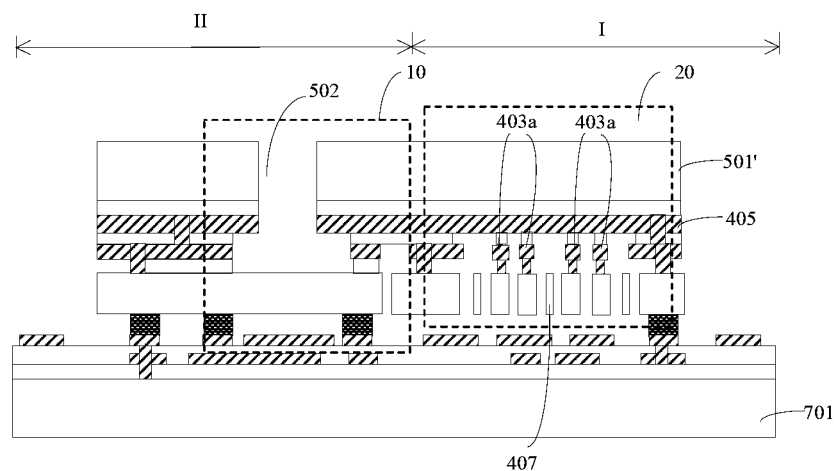

An eighth embodiment of the integrated inertial sensor and pressure sensor is further provided according to the invention, and is referred to in FIG. 23. The eighth embodiment differs from all the above embodiments in that the sensitive film of the pressure sensor is formed by using the second region II of the first substrate, and the fixed electrode of the pressure sensor is formed by using the conductive material on the third substrate at the position corresponding to the sensitive film. In this embodiment, no additional movable electrode of the pressure sensor is formed. The method for forming the structure as shown in FIG. 23 is similar to the method for forming the above structure, which will not be described in detail herein.

It is to be noted that if the thinned first substrate has a great thickness and the sensitive film of the pressure sensor is formed by using the first substrate, the formed pressure sensor may be applied to the case where great pressure needs to be detected. Similarly, in the embodiment of the present invention, if the sensitive film of the pressure sensor has a great thickness, or a thick sensitive film is formed by using multiple layers of materials, the formed pressure sensor may also be applied to the case where great pressure needs to be detected.

Therefore, by controlling the thickness of the sensitive film, the pressure sensor for sensing different pressure can be formed.

Figure 24:
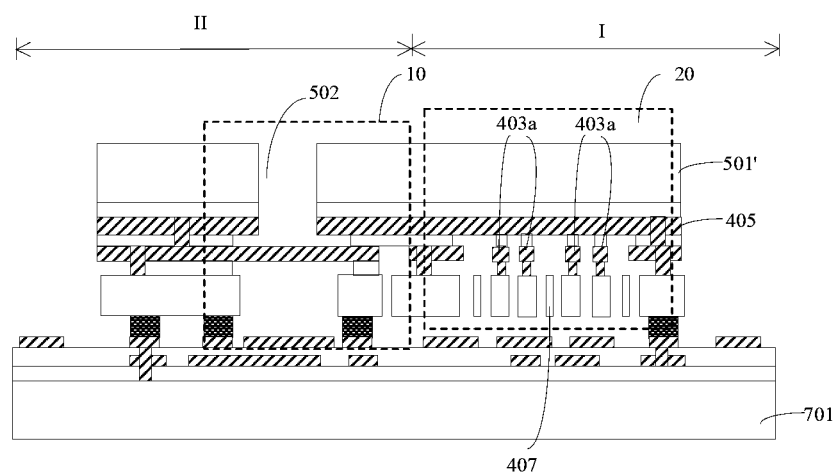

A ninth embodiment of the integrated inertial sensor and pressure sensor is further provided according to the invention, and is referred to in FIG. 24. The ninth embodiment differs from all the above embodiments in that the sensitive film of the pressure sensor is formed by using the first conductive layer in the second region II, and the fixed electrode of the pressure sensor is formed by using the conductive material on the third substrate at the position corresponding to the sensitive film. In this embodiment, no additional movable electrode of the pressure sensor is formed. The method for forming the structure as shown in FIG. 24 is similar to the method for forming the above structure, which will not be described in detail herein.

Figure 25:
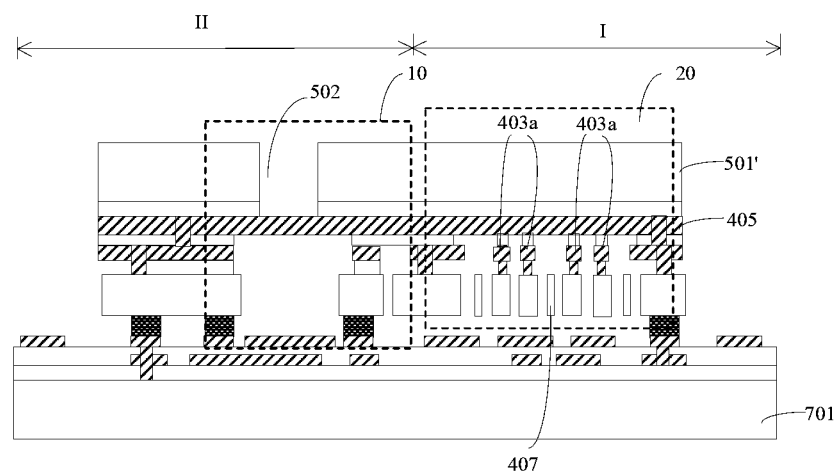

A tenth embodiment of the integrated inertial sensor and pressure sensor is further provided according to the invention, and is referred to in FIG. 25. The tenth embodiment differs from all the above embodiments in that the sensitive film of the pressure sensor is formed by using the second conductive layer in the second region II, and the fixed electrode of the pressure sensor is formed by using the conductive material on the third substrate at the position corresponding to the sensitive film. In this embodiment, no additional movable electrode of the pressure sensor is formed. The method for forming the structure as shown in FIG. 25 is similar to the method for forming the above structure, which will not be described in detail herein.

Different embodiments have been provided above for referring by those skilled in the art, and many variations can be made in practice, which will not be listed one by one herein. Based on the above embodiments, it is known by those skilled in the art how to implement flexibly. It may also be seen from the above embodiments that flexible layout can be made by using the method of the invention according to the actual device and design requirement, so as to achieve different purpose, and the size of the integrated inertial sensor and pressure sensor can be reduced.

Moreover, in the above method for forming the integrated inertial sensor and pressure sensor, the inertial sensor is illustrated by taking the X-axis sensor or the Y-axis sensor of the acceleration sensor as an example, and not all the structures of the X-axis sensor or the Y-axis sensor are illustrated and described in the above embodiments, but only the fixed electrode, the movable electrode, the first sealing sensor structure, the second sealing sensor structure and the corresponding interconnecting lines of the electrical interconnecting layer which are typical in the X-axis sensor or the Y-axis sensor are selected for illustration. As to the pressure sensor, the methods for forming the fixed electrode of the pressure sensor, and the movable electrode and/or the sensitive film of the pressure sensor are selected for illustration and description. In the above embodiments, the methods for forming the first sub-interconnecting line, the second sub-interconnecting line, the first inertial sensor structure and the first pressure sensor structure are illustrated and described. The first sub-interconnecting line, the second sub-interconnecting line, the first inertial sensor structure and the first pressure sensor structure are given to indicate other structures that may be used in the inertial sensor. Here, from these illustrations and descriptions, those skilled in the art can know that by using the method for forming the integrated inertial sensor and pressure sensor according to the invention, not only the movable electrodes of the inertial sensor and the pressure sensor which are movable, the fixed electrodes of the inertial sensor and the pressure sensor and the first sealing sensor structure and the second sealing sensor structure fixed on the first shielding electrode and the second shielding electrode can be formed, but also the first inertial sensor structure and the first pressure sensor structure fixed above the electrical interconnecting layer via the first insulating layer can be formed. That is, by using the method according to the invention, all the required structures of the inertial sensor and the pressure sensor can be formed. It is particularly to be noted that the scope of protection of the invention should not be limited excessively.

Further, in the above embodiments, the detailed description is given by taking the X-axis sensor or the Y-axis sensor of the acceleration sensor as an example. The Z-axis sensor of the acceleration sensor may also be formed by using the method according to the invention, and the difference only lies in the layout or design. It is particularly to be noted here that the scope of protection of the invention should not be limited excessively.

Further, in the above embodiments, the detailed description is given by taking the X-axis sensor or Y-axis sensor of the acceleration sensor as an example. In terms of the structure, the gyroscopic apparatus for sensing in each direction (i.e., the X-axis gyroscopic apparatus, the Y-axis gyroscopic apparatus and the Z-axis gyroscopic apparatus) has a similar structure as that of the complex of the sensors in three directions of the acceleration sensor (i.e., the X-axis sensor, the Y-axis sensor and the Z-axis sensor). The sensors of the acceleration sensor in each direction can be formed by using the method according to the invention, and the structure of the gyroscopic apparatus in each direction can also be formed by using the method according to the invention, the difference only lies in the layout or design. Thus the method for forming the gyroscopic apparatus will not be described in detail therein, and various modifications, amendments or supplements can be made by those skilled in the art based on the ordinary technical knowledge in the art and the embodiments of the invention.

The invention has been disclosed by the preferred embodiments as above, however these embodiments are not intended to limit the claims. Possible modifications and amendments may be made by those skilled in the art without deviating from the spirit and scope of the invention. Therefore, the scope of protection of the invention should be consistent with the scope defined by the claims of the invention.

The invention claimed is:

1. An integrated inertial sensor and pressure sensor, comprising:
   a first substrate comprising a first surface and a second surface opposite to the first surface, and the first substrate comprising a first region and a second region;
   at least one or more conductive layers, deposited on the first surface of the first substrate, wherein the at least one or more conductive layers comprises a first electrical shielding layer for the inertial sensor, and wherein the first electrical shielding layer is electrically connected to the first substrate through one or more vias with the one or more vias only between the first electrical shielding and the first substrate;
   a movable sensitive element of the inertial sensor, formed by using the first region of the first substrate;
   a second substrate and a third substrate, the second substrate being coupled to a surface of the conductive layer on the first surface of the first substrate, the third substrate being coupled to the second surface of the first substrate in which the movable sensitive element of the inertial sensor is formed, and the third substrate and the second substrate are respectively arranged on two opposite sides of the movable sensitive element of the inertial sensor; and
   a sensitive film of the pressure sensor, comprising at least the second region of the first substrate, or comprising at least one of the conductive layers on the second region of the first substrate.

2. The integrated inertial sensor and pressure sensor according to claim 1, wherein the first substrate is formed of monocrystalline semiconductor material.

3. The integrated inertial sensor and pressure sensor according to claim 1, wherein the at least one or more conductive layers further comprise an electrical interconnecting layer for the inertial sensor.

4. The integrated inertial sensor and pressure sensor according to claim 3, wherein in a case that the sensitive film of the pressure sensor comprises one of the conductive layers on the second region of the first substrate, the sensitive film comprises a material layer which is the same layer as that for forming the first electrical shielding layer for the inertial sensor, or comprises a material layer which is the same layer as that for forming the electrical interconnecting layer for the inertial sensor.

5. The integrated inertial sensor and pressure sensor according to claim 4, wherein in a case that the sensitive film of the pressure sensor comprises one of the conductive layers on the second region of the first substrate, a fixed electrode of the pressure sensor is formed by using the second region of the first substrate, and a through hole is formed in the fixed electrode of the pressure sensor.

6. The integrated inertial sensor and pressure sensor according to claim 1, wherein the at least one or more conductive layers further comprises an electrical interconnecting layer for the inertial sensor, and the electrical interconnecting layer is closer to the first surface of the first substrate than the first electrical shielding layer.

7. The integrated inertial sensor and pressure sensor according to claim 1, wherein in a case that the sensitive film of the pressure sensor comprises one of the conductive layers on the second region of the first substrate, a fixed electrode of the pressure sensor is formed by using another layer of the conductive layers on the second region of the first substrate, or formed by using the second region of the first substrate, or formed by using a conductive material layer on the third substrate.

8. The integrated inertial sensor and pressure sensor according to claim 1, wherein in a case that the sensitive film of the pressure sensor comprises at least one of the conductive layers on the second region of the first substrate, the integrated inertial sensor and pressure sensor further comprises a fixed electrode of the pressure sensor opposite to the sensitive film of the pressure sensor, and a movable sensitive element of the pressure sensor formed between the sensitive film of the pressure sensor and the fixed electrode of the pressure sensor, wherein the movable sensitive element of the pressure sensor is connected with the sensitive film by a connecting arm, and a through hole is formed in the movable sensitive element of the pressure sensor.

9. The integrated inertial sensor and pressure sensor according to claim 1, wherein the sensitive film of the pressure sensor comprises a plurality of layers;
   the plurality of layers comprises at least one of the conductive layers.

10. The integrated inertial sensor and pressure sensor according to claim 1, further comprising:
    a pressure port opening, through which the sensitive film of the pressure sensor is exposed.

11. The integrated inertial sensor and pressure sensor according to claim 1, wherein in a case that the sensitive film of the pressure sensor comprises the second region of the first substrate, a fixed electrode of the pressure sensor is formed by using a layer of the conductive layers on the second region of the first substrate, or formed by using a conductive material layer on the third substrate.

12. A method for forming an integrated inertial sensor and pressure sensor, comprising:
    providing a first substrate, wherein the first substrate comprises a first surface and a second surface opposite to the first surface, and the first substrate comprises a first region and a second region;

depositing one or more conductive layers on the first surface of the first substrate, wherein depositing the one or more conductive layers comprises: depositing a first electrical shielding layer for the inertial sensor and forming one or more vias, wherein the one or more vias electrically connect the first electrical shielding layer to the first substrate and are only between the first electrical shielding layer and the first substrate;

providing a second substrate and a third substrate;

coupling the second substrate to a surface of the conductive layer on the first surface of the first substrate after the one or more conductive layers are deposited;

forming a movable sensitive element of the inertial sensor by using the first region of the first substrate;

forming a sensitive film of the pressure sensor, wherein the sensitive film comprises at least the second region of the first substrate, or comprises at least one of the conductive layers on the second region of the first substrate; and coupling the third substrate to the second surface of the first substrate in which the movable sensitive element of the inertial sensor is formed, wherein the third substrate and the second substrate are respectively arranged on two opposite sides of the movable sensitive element of the inertial sensor.

13. The method for forming the integrated inertial sensor and pressure sensor according to claim 12, wherein the first substrate is formed of monocrystalline semiconductor material.

14. The method for forming the integrated inertial sensor and pressure sensor according to claim 12, wherein the depositing the one or more conductive layers further comprises: depositing an electrical interconnecting layer for the inertial sensor, and the electrical interconnecting layer is closer to the first surface of the first substrate than the first electrical shielding layer.

15. The method for forming the integrated inertial sensor and pressure sensor according to claim 12, wherein in a case that the sensitive film of the pressure sensor comprises one of the conductive layers on the second region of the first substrate, the method further comprises:

forming a fixed electrode of the pressure sensor by using another layer of the conductive layers on the second region of the first substrate, or by using the second region of the first substrate, or by using a conductive material layer on the third substrate.

16. The method for forming the integrated inertial sensor and pressure sensor according to claim 12, wherein in a case that the sensitive film of the pressure sensor comprises one of the conductive layers on the second region of the first substrate, the method further comprises:

forming a fixed electrode of the pressure sensor by using the second region of the first substrate, and forming a through hole in the fixed electrode of the pressure sensor.

17. The method for forming the integrated inertial sensor and pressure sensor according to claim 12, wherein in a case that the sensitive film of the pressure sensor comprises at least one of the conductive layers on the second region of the first substrate, the method further comprises:

forming a fixed electrode of the pressure sensor opposite to the sensitive film of the pressure sensor, wherein the fixed electrode of the pressure sensor is formed by using the second region of the first substrate;

forming a movable sensitive element of the pressure sensor between the sensitive film of the pressure sensor and the fixed electrode of the pressure sensor, wherein the movable sensitive element of the pressure sensor is formed by using another layer of the conductive layers;

forming a connecting arm between the movable sensitive element of the pressure sensor and the sensitive film for connecting the movable sensitive element of the pressure sensor with the sensitive film; and forming a through hole in the movable sensitive element of the pressure sensor.

18. The method for forming the integrated inertial sensor and pressure sensor according to claim 12, wherein the sensitive film of the pressure sensor comprises a plurality of layers;

the plurality of layers comprises at least one of the conductive layers on the second region of the first substrate, the sensitive films of the pressure sensor further comprise a material layer above or below the conductive layer the sensitive films of the pressure sensor comprise.

19. The method for forming the integrated inertial sensor and pressure sensor according to claim 12, further comprising forming a pressure port opening through which the sensitive film is exposed.

20. The method for forming the integrated inertial sensor and pressure sensor according to claim 12, wherein in a case that the sensitive film of the pressure sensor comprises the second region of the first substrate, the method further comprises: forming a fixed electrode of the pressure sensor by using a layer of the conductive layers on the second region of the first substrate, or by using a conductive material layer formed on the third substrate.

* * * * *